(12) United States Patent
Ho et al.

(10) Patent No.: US 12,543,518 B2
(45) Date of Patent: Feb. 3, 2026

(54) VAPOR DEPOSITION OF TELLURIUM NANOMESH ELECTRONICS ON ARBITRARY SURFACES AT LOW TEMPERATURE

(71) Applicant: City University of Hong Kong, Kowloon (HK)

(72) Inventors: Johnny Chung Yin Ho, Shatin (HK); You Meng, Kowloon (HK); Wei Wang, Kowloon (HK); Weijun Wang, Yau Tsim Mong (HK)

(73) Assignee: City University of Hong Kong, Kowloon (HK)

( * ) Notice: Subject to any disclaimer, the term of this patent is extended or adjusted under 35 U.S.C. 154(b) by 423 days.

(21) Appl. No.: 18/194,098

(22) Filed: Mar. 31, 2023

(65) Prior Publication Data

US 2024/0079234 A1    Mar. 7, 2024

Related U.S. Application Data

(60) Provisional application No. 63/403,809, filed on Sep. 5, 2022.

(51) Int. Cl.
*H01L 21/02*      (2006.01)
*H10D 48/04*     (2025.01)

(52) U.S. Cl.
CPC .. *H01L 21/02603* (2013.01); *H01L 21/02271* (2013.01); *H10D 48/04* (2025.01)

(58) Field of Classification Search
CPC ......... H01L 21/02603; H01L 21/02271; H01L 21/02389; H01L 21/02417; H01L 21/0242; H01L 21/02422; H01L 21/02647; H01L 21/02521; H01L 21/02361; H10D 48/04
See application file for complete search history.

(56) References Cited

U.S. PATENT DOCUMENTS

2009/0057839 A1* 3/2009 Lewis ............... H10D 62/122
                                                        257/618
2018/0269372 A1* 9/2018 Lee ..................... C08L 79/08

OTHER PUBLICATIONS

Lan, C. et al. Direct visualization of grain boundaries in 2D monolayer WS2 via induced growth of CdS nanoparticle chains. Small Methods 3, 1800245 (2019).
Lan, C. et al. Wafer-scale synthesis of monolayer WS2 for high-performance flexible photodetectors by enhanced chemical vapor deposition. Nano Res. 11, 3371-3384, doi:10.1007/s12274-017-1941-4 (2018).

(Continued)

*Primary Examiner* — Dale E Page
*Assistant Examiner* — Quovaunda Jefferson
(74) *Attorney, Agent, or Firm* — Renner, Kenner, Greive, Bobak, Taylor & Weber

(57) ABSTRACT

A method of fabricating semiconducting tellurium (Te) nanomesh. The method includes the steps of preparing a substrate, vaporizing Te powders under a first temperature; and growing Te nanomesh on the substrate using the vaporized Te powders under a second temperature. The first temperature is higher than the second temperature. The rationally designed nanomesh exhibits exciting properties, such as micrometer-level patterning capacity, excellent field-effect hole mobility, fast photoresponse in the optical communication region, and controllable electronic structure of the mixed-dimensional heterojunctions.

11 Claims, 28 Drawing Sheets

(56) References Cited

OTHER PUBLICATIONS

Zhang, X., Shao, Z., Zhang, X., He, Y. & Jie, J. Surface Charge Transfer Doping of Low-Dimensional Nanostructures toward High-Performance Nanodevices. Adv. Mater. 28, 10409-10442, doi:10.1002/adma.201601966 (2016).

Fang, H. et al. Degenerate n-doping of few-layer transition metal dichalcogenides by potassium. Nano Lett. 13, 1991-1995, doi:10.1021/nl400044m (2013).

S Dang. et al. Piezoelectric modulation of broadband photoresponse of flexible tellurium nanomesh photodetectors https://doi.org/10.1088/1361-6528/ab53b3.

J. Liu et al. J. Am. Chem. Soc. 2010, 132, 8945-8952 Mesostructured Assemblies of Ultrathin Superlong Tellurium Nanowires and Their Photoconductivity.

Sutter, P., Wimer, S. & Sutter, E. Chiral twisted van der Waals nanowires. Nature 570, 354-357, doi:10.1038/s41586-019-1147-x (2019).

Gu, L. et al. A biomimetic eye with a hemispherical perovskite nanowire array retina. Nature 581, 278-282 (2020).

Gazibegovic, S. et al. Epitaxy of advanced nanowire quantum devices. Nature 548, 434-438 (2017).

Qin, J.-K. et al. Raman response and transport properties of tellurium atomic chains encapsulated in nanotubes. Nature Electronics 3, 141-147 (2020).

Jia, C., Lin, Z., Huang, Y. & Duan, X. Nanowire electronics: from nanoscale to macroscale. Chem. Rev. 119, 9074-9135 (2019).

Yao, J., Yan, H. & Lieber, C. M. A nanoscale combing technique for the large-scale assembly of highly aligned nanowires. Nat. Nanotechnol. 8, 329 (2013).

Fan, Z. et al. Wafer-scale assembly of highly ordered semiconductor nanowire arrays by contact printing. Nano Lett. 8, 20-25 (2008).

Meng, Y. et al. Artificial visual systems enabled by quasi-two-dimensional electron gases in oxide superlattice nanowires. Sci. Adv. 6, eabc6389 (2020).

Fan, Z., Ho, J. C., Jacobson, Z. A., Razavi, H. & Javey, A. Large-scale, heterogeneous integration of nanowire arrays for image sensor circuitry. Proc. Natl. Acad. Sci. U.S.A. 105, 11066-11070 (2008).

Cao, Q. et al. Medium-scale carbon nanotube thin-film integrated circuits on flexible plastic substrates. Nature 454, 195-500, doi:10.1038/nature07110 (2008).

Sun, D.-m. et al. Flexible high-performance carbon nanotube integrated circuits. Nat. Nanotechnol. 6, 156-161 (2011).

Takei, K. et al. Nanowire active-matrix circuitry for low-voltage macroscale artificial skin. Nat. Mater. 9, 821-826, doi:10.1038/nmat2835 (2010).

Wang, C. et al. User-interactive electronic skin for instantaneous pressure visualization. Nat. Mater. 12, 899-904 (2013).

Tsivion, D., Schvartzman, M., Popovitz-Biro, R., von Huth, P. & Joselevich, E. Guided growth of millimeter-long horizontal nanowires with controlled orientations. Science 333, 1003-1007, doi:10.1126/science.1208455 (2011).

Wang, Y. et al. Field-effect transistors made from solution-grown two-dimensional tellurene. Nature Electronics 1, 228-236, doi:10.1038/s41928-018-0058-4 (2018).

Amani, M. et al. Solution-Synthesized High-Mobility Tellurium Nanoflakes for Short-Wave Infrared Photodetectors. ACS Nano 12, 7253-7263, doi:10.1021/acsnano.8b03424 (2018).

Zhao, C. et al. Evaporated tellurium thin films for p-type field-effect transistors and circuits. Nat. Nanotechnol. 15, 53-58, doi:10.1038/s41565-019-0585-9 (2020).

Tan, C. et al. Evaporated SexTe1-x Thin Films with Tunable Bandgaps for Short Wave Infrared Photodetectors. Adv. Mater., 2001329, doi:10.1002/adma.202001329 (2020).

Meng, Y., Wang, W. & Ho, J. C. One-Dimensional Atomic Chains for Ultimate-Scaled Electronics. ACS Nano 16, 13314-13322, doi:10.1021/acsnano.2c06359 (2022).

Jaegermann, W., Rudolph, R., Klein, A. & Pettenkofer, C. Perspectives of the concept of van der Waals epitaxy: growth of lattice mismatched GaSe (0001) films on Si (111), Si (110) and Si (100). Thin Solid Films 380, 276-281 (2000).

Ge, Y. et al. Direct room temperature welding and chemical protection of silver nanowire thin films for high performance transparent conductors. J. Am. Chem. Soc. 140, 193-199 (2018).

Sen, S. et al. Synthesis of tellurium nanostructures by physical vapor deposition and their growth mechanism. J Crystal Growth 8, 238-242 (2008).

Ta, H. Q. et al. Stranski-Krastanov and Volmer-Weber CVD growth regimes to control the stacking order in bilayer graphene. Nano Lett. 16, 6403-6410, doi:1530 (2016).

Zhang, Z. & Lagally, M. G. Atomistic processes in the early stages of thin-film growth. Science 276, 377-383 (1997).

Fisher, L. & Israelachvili, J. Direct experimental verification of the Kelvin equation for capillary condensation. Nature 277, 548-549 (1979).

Fisher, L., Gamble, R. & Middlehurst, J. The Kelvin equation and the capillary condensation of water. Nature 290, 575-576 (1981).

Yoon, S.-S. & Khang, D.-Y. Room-temperature chemical welding and sintering of metallic nanostructures by capillary condensation. Nano Lett. 16, 3550-3556 (2016).

Liang, D., Wei, T., Wang, J. & Li, J. Quasi van der Waals epitaxy nitride materials and devices on two dimension materials. Nano Energy 69, 104463 (2020).

Zhang, H. et al. Strain Relaxation in "2D/2D and 2D/3D Systems": Highly Textured Mica/Bi2Te3, Sb2Te3/Bi2Te3, and Bi2Te3/GeTe Heterostructures. ACS Nano 15, 2869-2879, doi:10.1021/acsnano.0c08842 (2021).

De la Mata, M., Magén, C., Caroff, P. & Arbiol, J. Atomic Scale Strain Relaxation in Axial Semiconductor III-V Nanowire Heterostructures. Nano Lett. 14, 6614-6620, doi:10.1021/nl503273j (2014).

Bae, S.-H. et al. Graphene-assisted spontaneous relaxation towards dislocation-free heteroepitaxy. Nat. Nanotechnol. 15, 272-276, doi:10.1038/s41565-020-0633-5 (2020).

Liu, Y., Huang, Y. & Duan, X. Van der Waals integration before and beyond two-dimensional materials. Nature 567, 323-333 (2019).

Liao, M. et al. Ultra-low friction and edge-pinning effect in large-lattice-mismatch van der Waals heterostructures. Nat. Mater. 21, 47-53 (2022).

Li, H. et al. Superlubricity between MoS2 monolayers. Adv. Mater. 29, 1701474 (2017).

Rokni, H. & Lu, W. Direct measurements of interfacial adhesion in 2D materials and van der Waals heterostructures in ambient air. Nat. Commun. 11, 5607 (2020).

Bürger, J.-C. et al. Analysis of the Growth of Laterally Aligned SnO2 Nanowires by Thermodynamic Considerations and Experiments. Crystal Growth & Design 21, 191-199, doi:10.1021/acs.cgd.0c00983 (2021).

Qiao, J. et al. Few-layer Tellurium: one-dimensional-like layered elementary semiconductor with striking physical properties. Science Bulletin 63, 159-168 (2018).

Qiu, G. et al. Quantum Hall effect of Weyl fermions in n-type semiconducting tellurene. Nat. Nanotechnol. 15, 585-591 (2020).

Ren, X. et al. Gate-tuned insulator-metal transition in electrolyte-gated transistors based on tellurene. Nano Lett. 19, 4738-4744 (2019).

Guo, Y. et al. Additive manufacturing of patterned 2D semiconductor through recyclable masked growth. Proceedings of the National Academy of Sciences 116, 3437-3442 (2019).

Wang, Y., Fedin, I., Zhang, H. & Talapin, D. V. Direct optical lithography of functional inorganic nanomaterials. Science 357, 385-388 (2017).

Conti, S. et al. Low-voltage 2D materials-based printed field-effect transistors for integrated digital and analog electronics on paper. Nat. Commun. 11, 3566 (2020).

Li, D. et al. Ultra-fast photodetectors based on high-mobility indium gallium antimonide nanowires. Nat. Commun. 10, 1664 (2019).

Wang, P. et al. Sensing infrared photons at room temperature: from bulk materials to atomic layers. Small 15, 1904396 (2019).

(56) References Cited

OTHER PUBLICATIONS

Rogalski, A., Kopytko, M. & Martyniuk, P. Two-dimensional infrared and terahertz detectors: Outlook and status. Applied Physics Reviews 6, 021316 (2019).

Meng, Y. et al. Perovskite Core—Shell Nanowire Transistors: Interfacial Transfer Doping and Surface Passivation. ACS Nano 14, 12749-12760 (2020).

Meng, Y. et al. Direct Vapor-Liquid-Solid Synthesis of All-Inorganic Perovskite Nanowires for High-Performance Electronics and Optoelectronics. ACS Nano 13, 6060-6070, doi:10.1021/acsnano.9b02379 (2019).

Tong, L. et al. Stable mid-infrared polarization imaging based on quasi-2D tellurium at room temperature. Nat. Commun. 11, 2308 (2020).

Wang, Q. et al. Van der Waals epitaxy and photoresponse of hexagonal tellurium nanoplates on flexible mica sheets. ACS Nano 8, 7497-7505 (2014).

Kang, S. et al. Broad spectral response of an individual tellurium nanobelt grown by molecular beam epitaxy. Nanoscale 11, 1879-1886 (2019).

\* cited by examiner

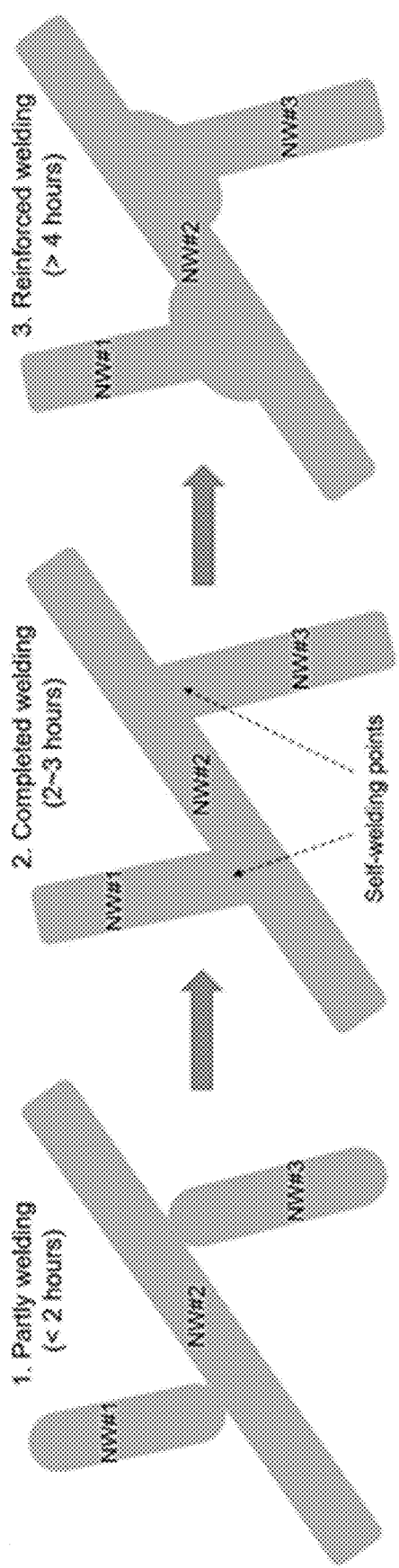
Fig.2e
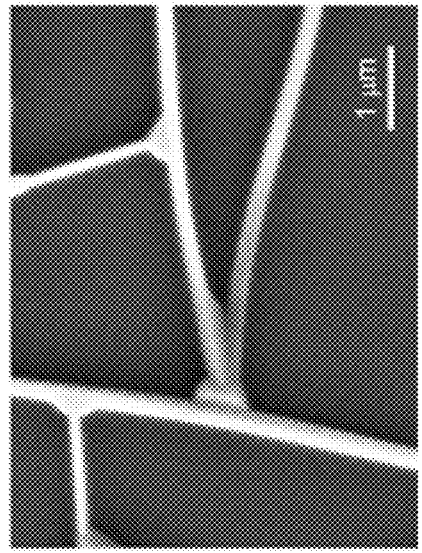
Fig.2f3
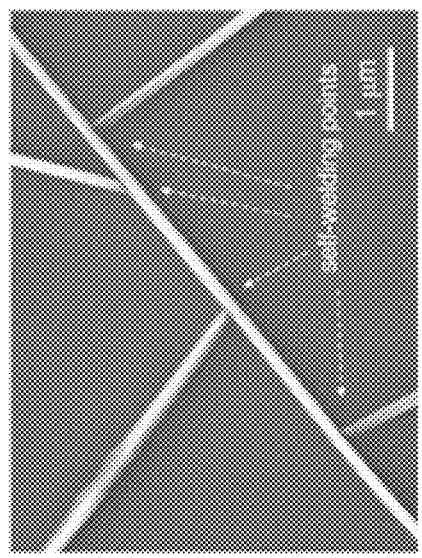
Fig.2f2
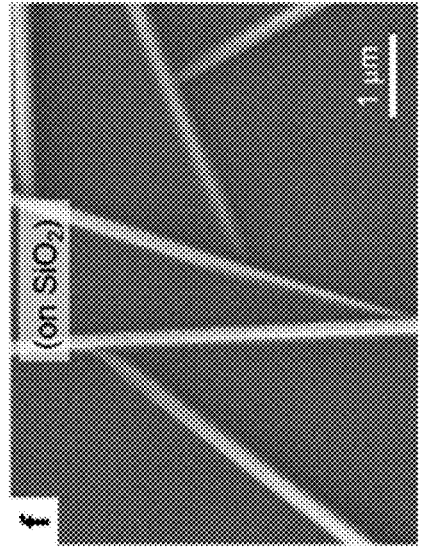
Fig.2f1

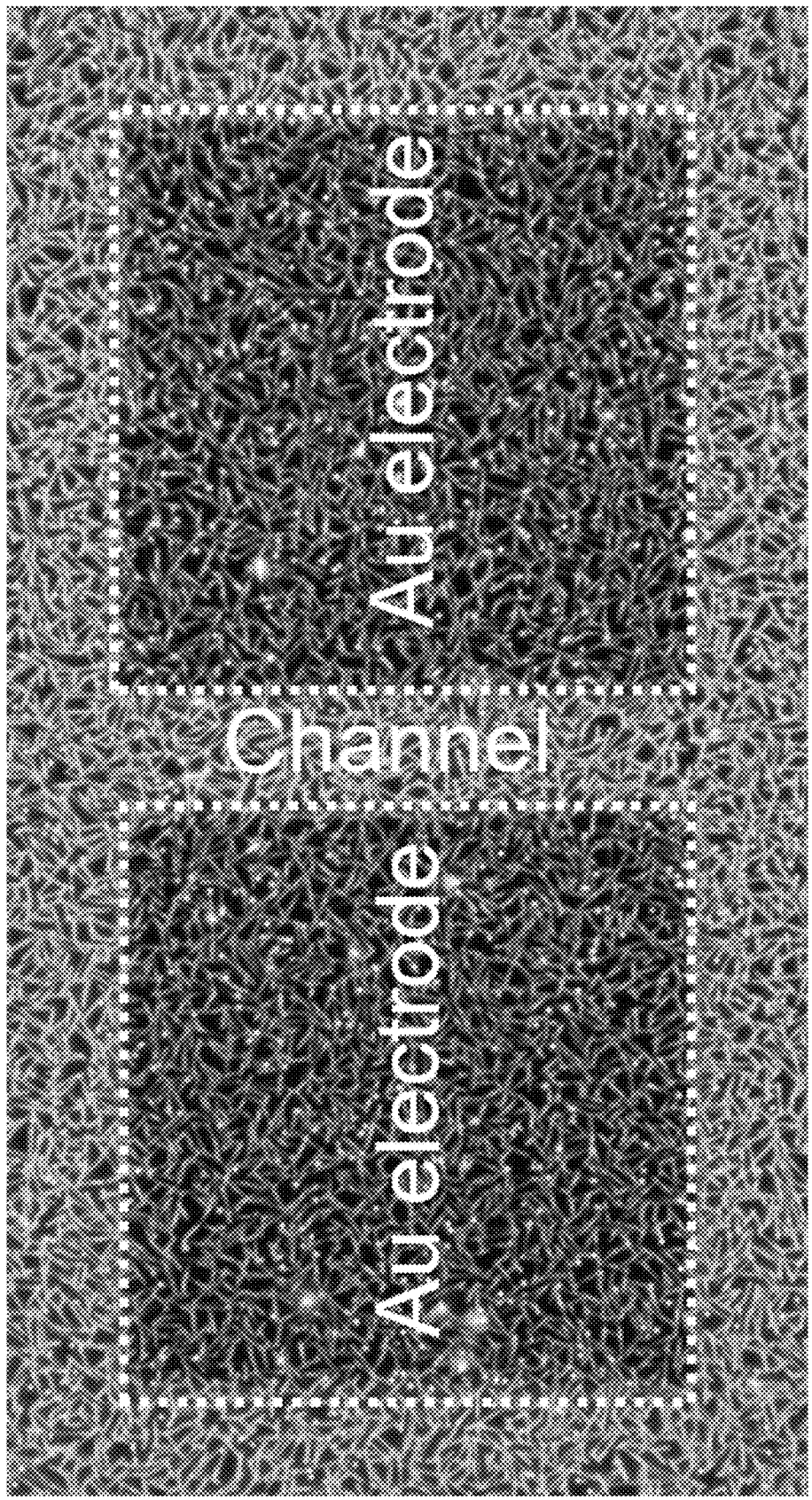
Fig.3h1

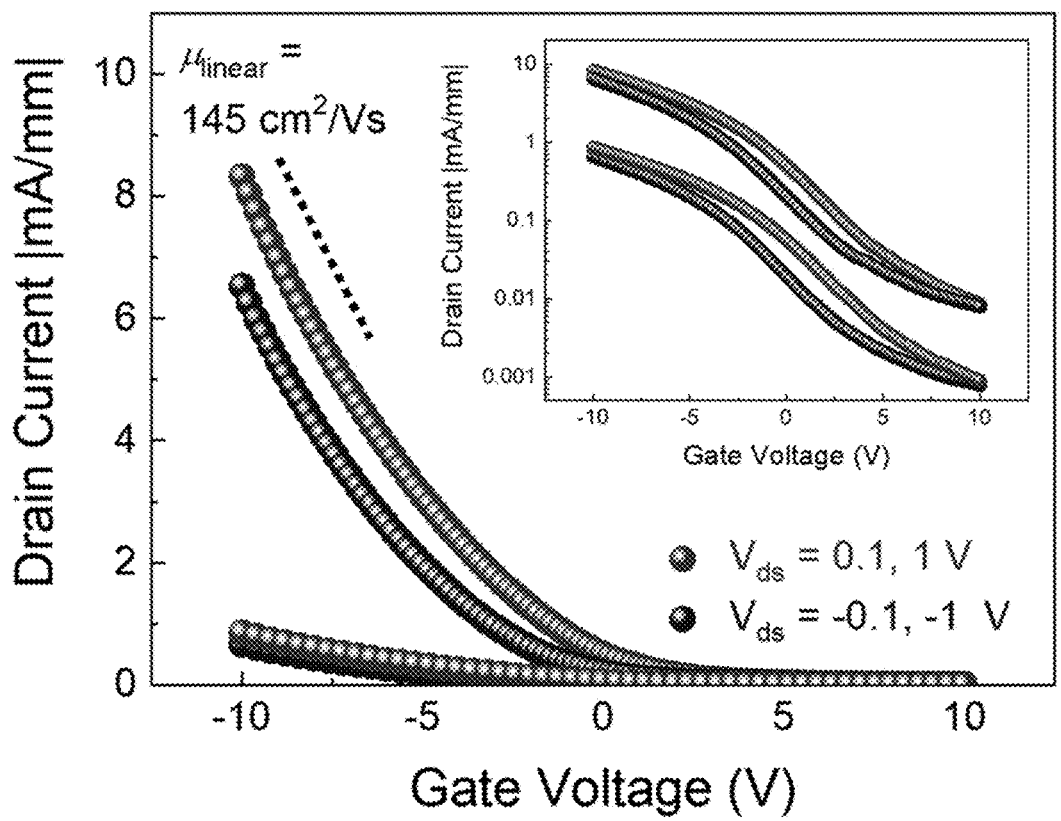
Fig.3h2
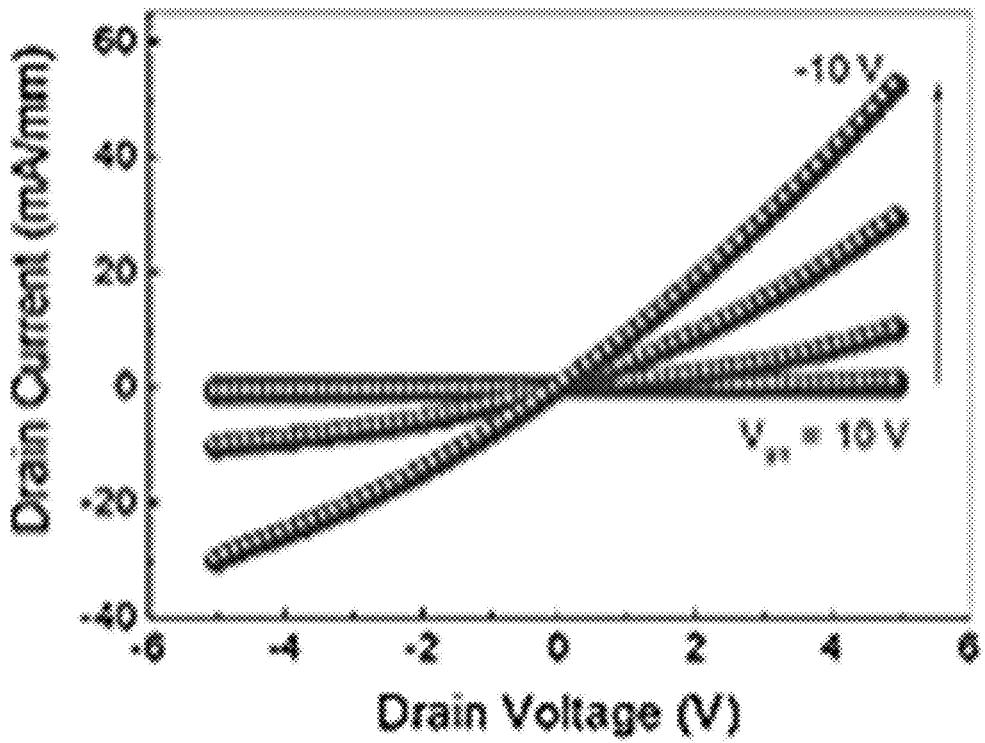
Fig.3h3

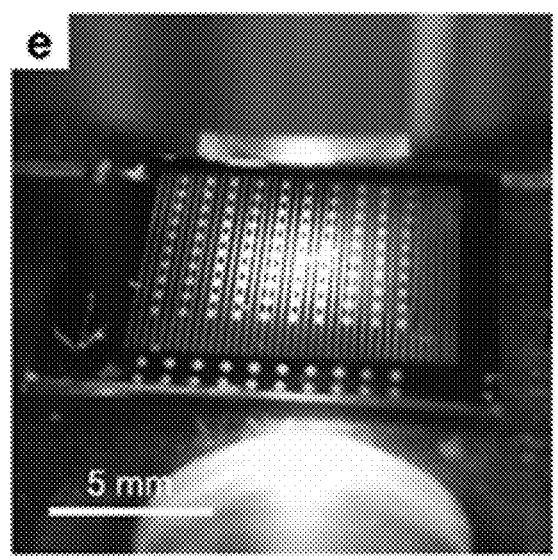
Fig.4e1
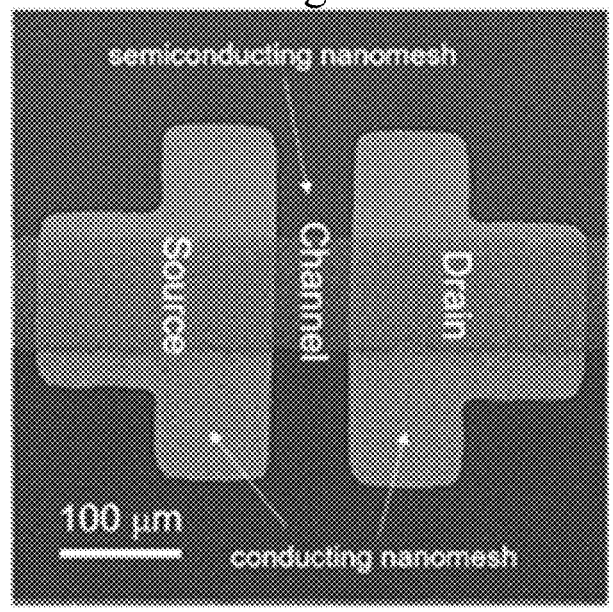
Fig.4e2
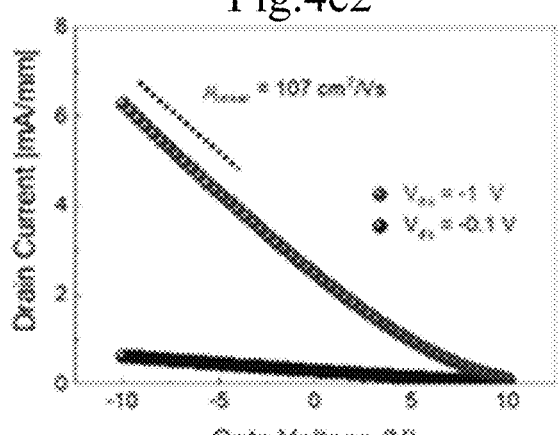
Fig.4e3

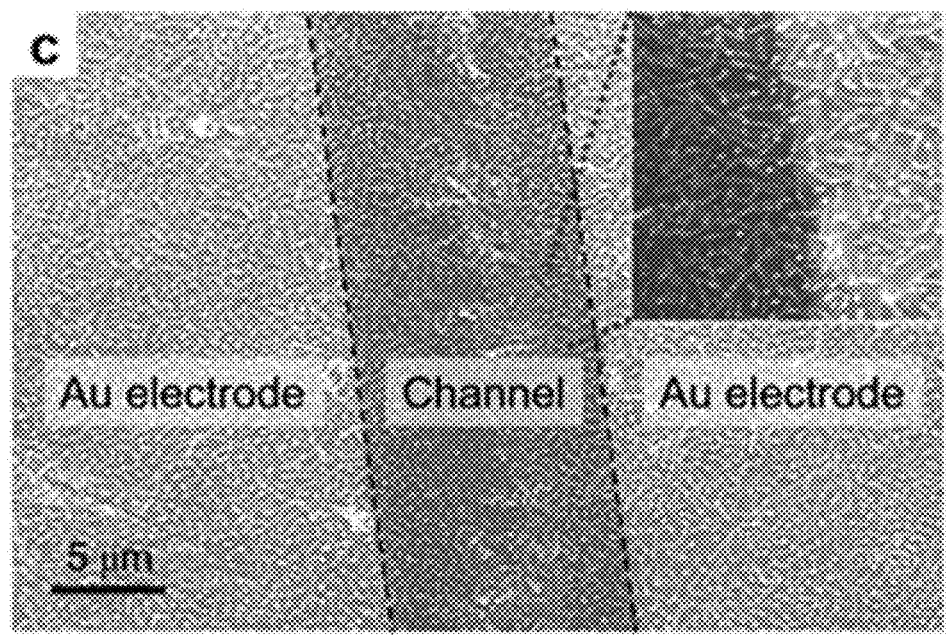
Fig.5c
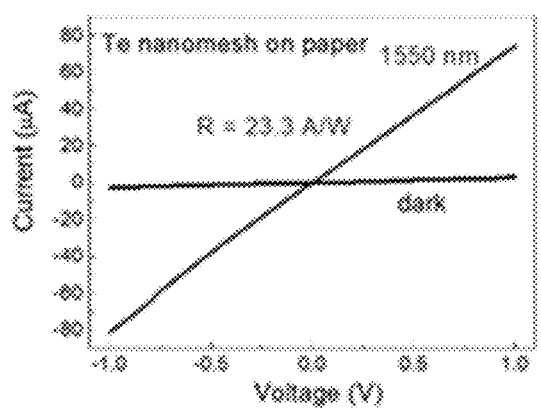
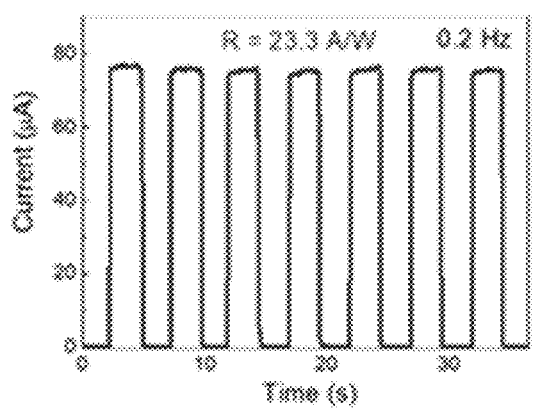
Fig.5d1            Fig.5d2

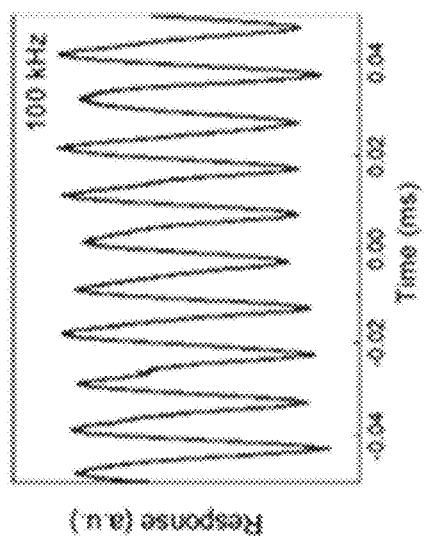
Fig.5e1
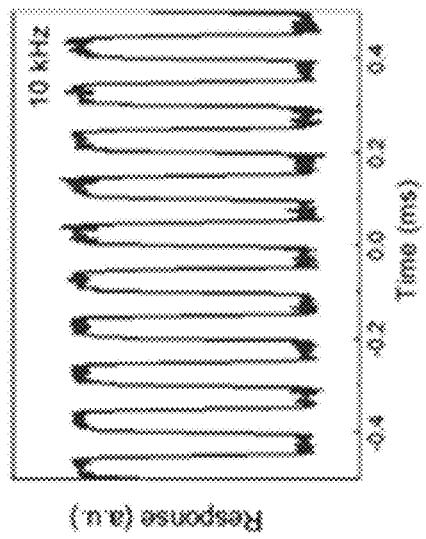
Fig.5e2
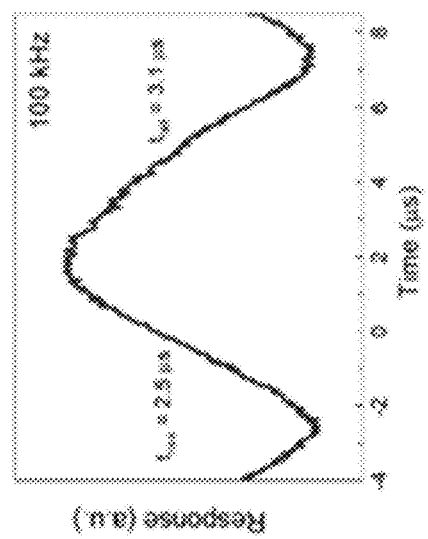
Fig.5e3
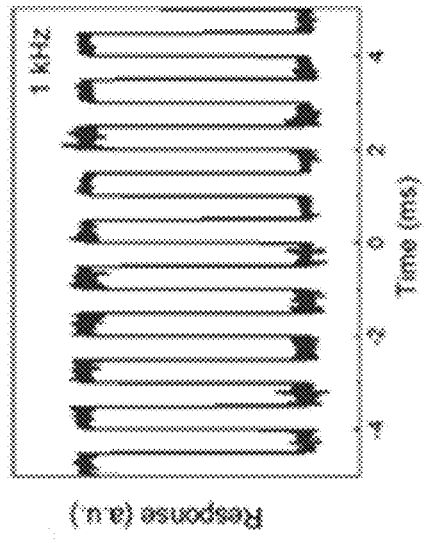
Fig.5e4
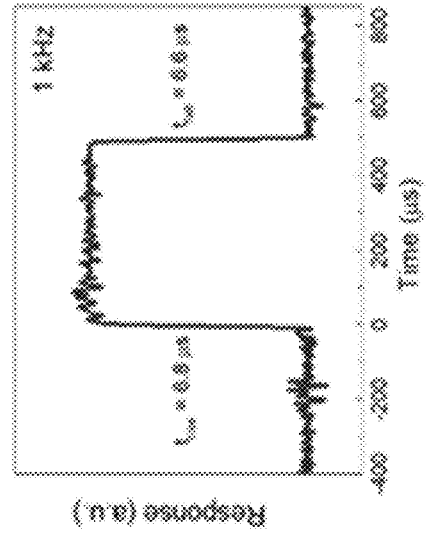
Fig.5e5
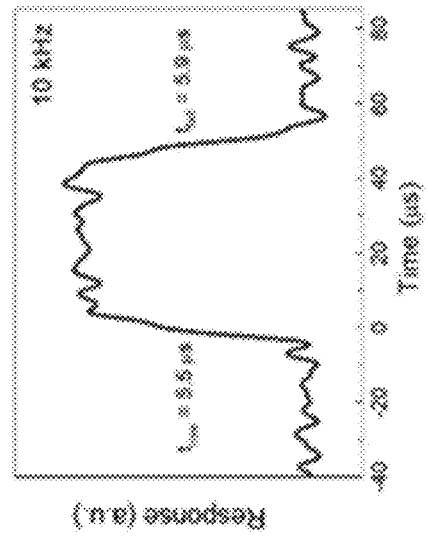
Fig.5e6

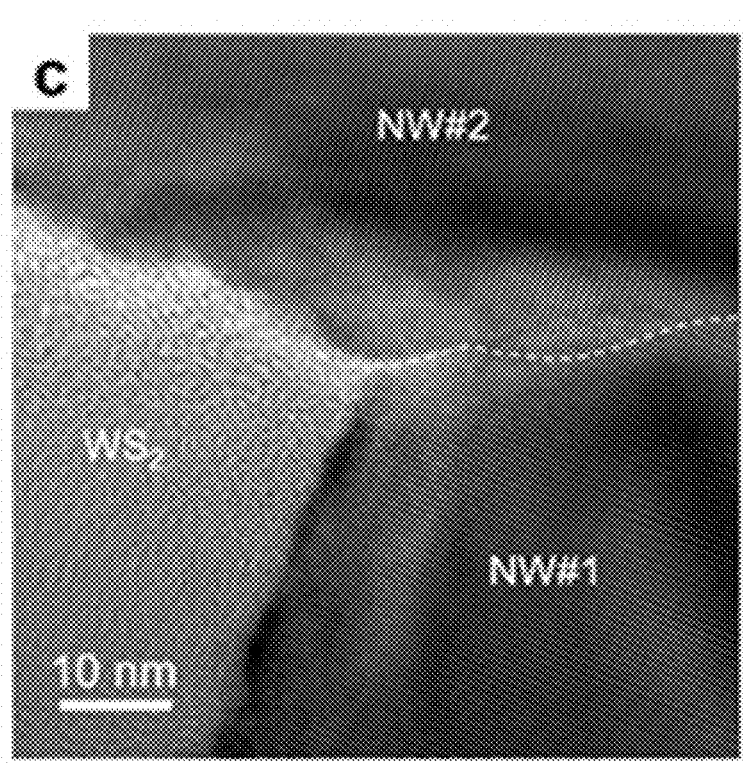
Fig. 6c1
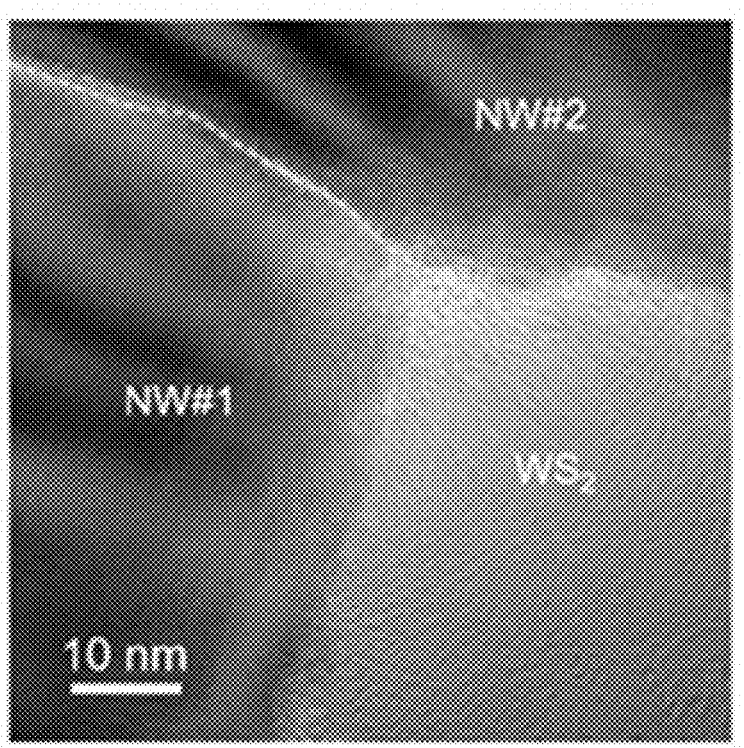
Fig. 6c2

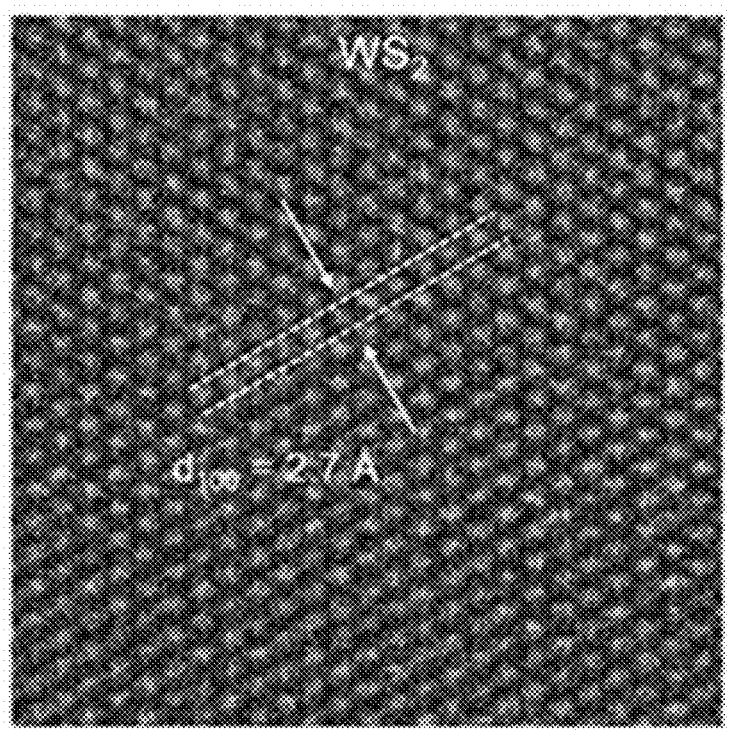
Fig. 6c3
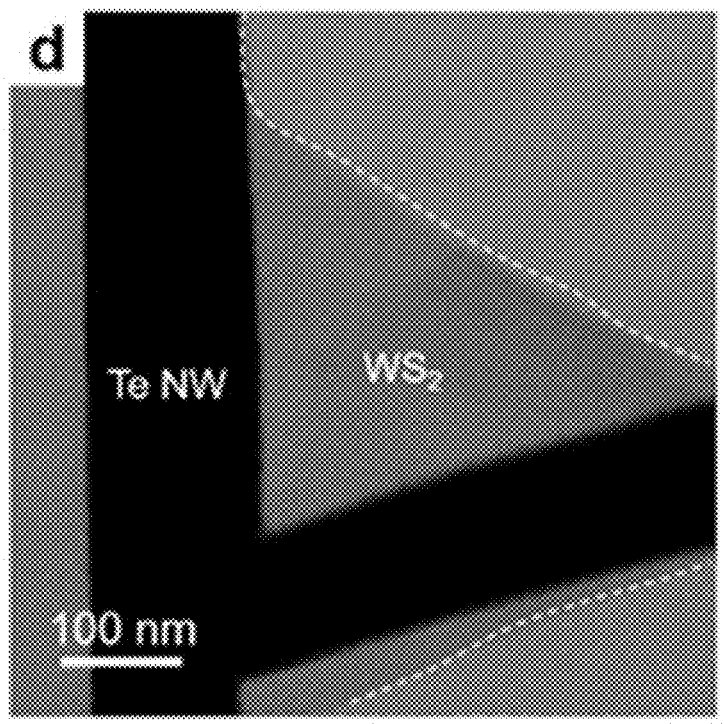
Fig. 6d1

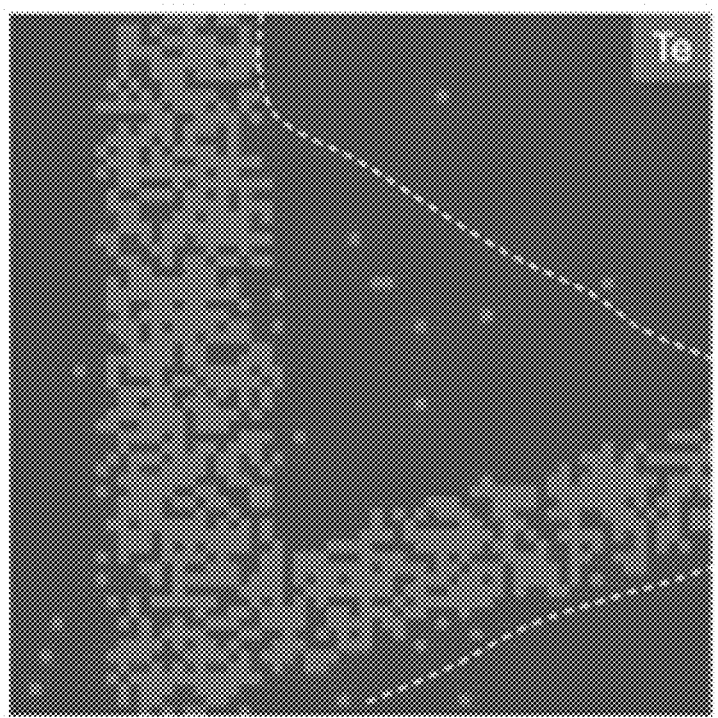
Fig. 6d2
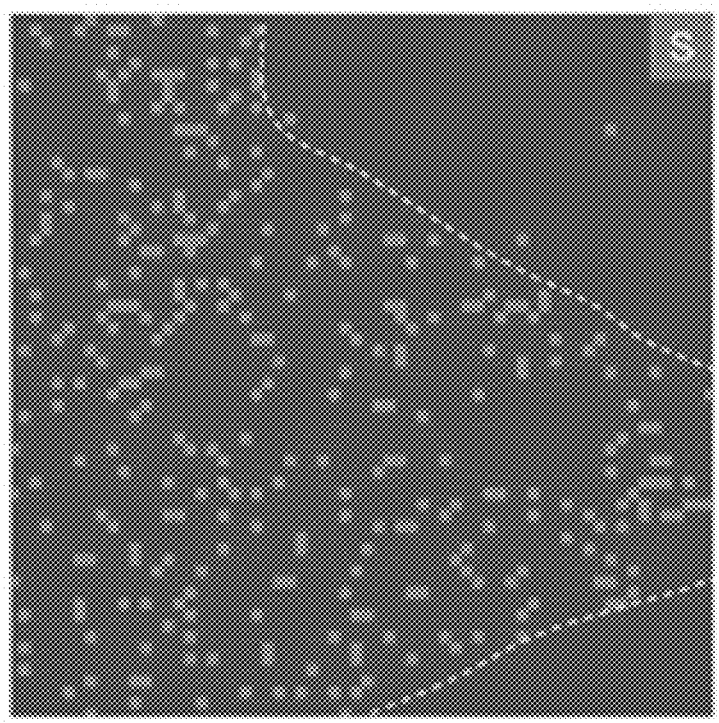
Fig. 6d3

VAPOR DEPOSITION OF TELLURIUM NANOMESH ELECTRONICS ON ARBITRARY SURFACES AT LOW TEMPERATURE

FIELD OF INVENTION

This invention relates to nanomaterials, and in particular to fabrication process of nanomaterials.

BACKGROUND OF INVENTION

In the past few decades, one-dimensional (1D) nanomaterials have been widely explored as the main driver for emerging electronics[1,2]. Particularly, nanowires (NWs) made of crystalline inorganic materials are able to meet all performance demands in terms of, but not limited to, carrier mobility, mechanical flexibility, energy efficiency, and optical transparency[3,4]. However, their scalability and integrability are still insufficient, especially when large-area and low-cost electronics are highly desired toward present-day Internet of Things (IoT) applications[5]. Since then, many NW assembly strategies, including post-synthesis assemblies and in-situ epitaxial growths, have been developed to tackle the issues of scalability and integrability by configuring large-scale crystalline NW parallel arrayed or random networked films.

Post-synthesis assemblies, such as contact printing and solution-phase deposition, are commonly used to assemble crystalline NWs into high-performance electronics and optoelectronics[6,7-8-9]. Taking advantage of post-synthesis assembly, several groups have developed circuit-level mechanically flexible applications, e.g., logic gates[10], ring oscillators[11], and artificial skins[12,13] using group III-V parallel-array NWs and carbon nanotube (CNT) thin films as active components. It is noted that although these assembly methods are generally applicable to different 1D nanomaterials, the cost-intensive and slow process natures would hinder the practical utilization of post-synthesis assembly processes[5]. Alternatively, to bypass the complicated two-step assembly process, in-situ epitaxial growths are intensely studied to construct 1D materials in a bottom-up manner and explore their functional devices[3,14] In some cases, for instance, gallium nitride (GaN) NWs with controlled crystallographic orientations are grown on specific crystal planes of sapphire ($\alpha$-$Al_2O_3$)[14]; however, the high growth temperature, stringent substrate requirement of atomically flat and faceted surfaces, and elusive epitaxial relationships are always involved, which add apparent complexities to the standard material processing.

Under these considerations, alternative materials and growth strategy are desired to address the current challenges on 1D nanomaterials. Recently, elemental tellurium (Te) microplates[15,16], thin films[17,18], and 1D chains[4,19] are demonstrated excellent electrical device performance with good environmental stability and high hole mobility, mainly arising from their narrow bandgap (0.35 eV) and high current-carrying ability. As a kind of "DNA-like" inorganic molecules, 1D Te atomic chains are packed in a hexagonal array by weak forces, called van der Waals (vdWs) interactions, to form a crystal, while in each atomic chain, the covalently bonded Te atoms are helically sequenced along the c-axis[15]. The vdWs interactions, together with the highly anisotropic crystalline structure of Te crystal, would potentially dictate the 1D nanostructured growth. Such a true 1D system, consisting of vdWs bonded atomic chains, provides opportunities to overcome those severe constraints on fabricating traditional 1D materials[19].

REFERENCES

Each of the following references (and associated appendices and/or supplements) is expressly incorporated herein by reference in its entirety:

[1] Sutter, P., Wimer, S. & Sutter, E. Chiral twisted van der Waals nanowires. Nature 570, 354-357, doi:10.1038/s41586-019-1147-x (2019).

[2] Gu, L. et al. A biomimetic eye with a hemispherical perovskite nanowire array retina. Nature 581, 278-282 (2020).

[3] Gazibegovic, S. et al. Epitaxy of advanced nanowire quantum devices. Nature 548, 434-438 (2017).

[4] Qin, J.-K. et al. Raman response and transport properties of tellurium atomic chains encapsulated in nanotubes. Nature Electronics 3, 141-147 (2020).

[5] Jia, C., Lin, Z., Huang, Y. & Duan, X. Nanowire electronics: from nanoscale to macroscale. Chem. Rev. 119, 9074-9135 (2019).

[6] Yao, J., Yan, H. & Lieber, C. M. A nanoscale combing technique for the large-scale assembly of highly aligned nanowires. Nat. Nanotechnol. 8, 329 (2013).

[7] Fan, Z. et al. Wafer-scale assembly of highly ordered semiconductor nanowire arrays by contact printing. Nano Lett. 8, 20-25 (2008).

[8] Meng, Y. et al. Artificial visual systems enabled by quasi-two-dimensional electron gases in oxide superlattice nanowires. Sci. Adv. 6, eabc6389 (2020).

[9] Fan, Z., Ho, J. C., Jacobson, Z. A., Razavi, H. & Javey, A. Large-scale, heterogeneous integration of nanowire arrays for image sensor circuitry. Proc. Natl. Acad. Sci. U.S.A. 105, 11066-11070 (2008).

[10] Cao, Q. et al. Medium-scale carbon nanotube thin-film integrated circuits on flexible plastic substrates. Nature 454, 495-500, doi:10.1038/nature07110 (2008).

[11] Sun, D.-m. et al. Flexible high-performance carbon nanotube integrated circuits. Nat. Nanotechnol. 6, 156-161 (2011).

[12] Takei, K. et al. Nanowire active-matrix circuitry for low-voltage macroscale artificial skin. Nat. Mater. 9, 821-826, doi:10.1038/nmat2835 (2010).

[13] Wang, C. et al. User-interactive electronic skin for instantaneous pressure visualization. Nat. Mater. 12, 899-904 (2013).

[14] Tsivion, D., Schvartzman, M., Popovitz-Biro, R., von Huth, P. & Joselevich, E. Guided growth of millimeter-long horizontal nanowires with controlled orientations. Science 333, 1003-1007, doi:10.1126/science.1208455 (2011).

[15] Wang, Y. et al. Field-effect transistors made from solution-grown two-dimensional tellurene. Nature Electronics 1, 228-236, doi:10.1038/s41928-018-0058-4 (2018).

[16] Amani, M. et al. Solution-Synthesized High-Mobility Tellurium Nanoflakes for Short-Wave Infrared Photodetectors. ACS Nano 12, 7253-7263, doi:10.1021/acsnano.8b03424 (2018).

[17] Zhao, C. et al. Evaporated tellurium thin films for p-type field-effect transistors and circuits. Nat. Nanotechnol. 15, 53-58, doi:10.1038/s41565-019-0585-9 (2020).

[18] Tan, C. et al. Evaporated SexTel-x Thin Films with Tunable Bandgaps for Short Wave Infrared Photodetectors. Adv. Mater., 2001329, doi:10.1002/adma.202001329 (2020).

[19] Meng, Y., Wang, W. & Ho, J. C. One-Dimensional Atomic Chains for Ultimate-Scaled Electronics. ACS Nano 16, 13314-13322, doi:10.1021/acsnano.2c06359 (2022).

[20] Jaegermann, W., Rudolph, R., Klein, A. & Pettenkofer, C. Perspectives of the concept of van der Waals epitaxy: growth of lattice mismatched GaSe (0001) films on Si (111), Si (110) and Si (100). Thin Solid Films 380, 276-281 (2000).

[21] Ge, Y. et al. Direct room temperature welding and chemical protection of silver nanowire thin films for high performance transparent conductors. J. Am. Chem. Soc. 140, 193-199 (2018).

[22] Sen, S. et al. Synthesis of tellurium nanostructures by physical vapor deposition and their growth mechanism. J Crystal Growth 8, 238-242 (2008).

[23] Ta, H. Q. et al. Stranski-Krastanov and Volmer-Weber CVD growth regimes to control the stacking order in bilayer graphene. Nano Lett. 16, 6403-6410, doi:1530 (2016).

[24] Zhang, Z. & Lagally, M. G. Atomistic processes in the early stages of thin-film growth. Science 276, 377-383 (1997).

[25] Fisher, L. & Israelachvili, J. Direct experimental verification of the Kelvin equation for capillary condensation. Nature 277, 548-549 (1979).

[26] Fisher, L., Gamble, R. & Middlehurst, J. The Kelvin equation and the capillary condensation of water. Nature 290, 575-576 (1981).

[27] Yoon, S.-S. & Khang, D.-Y. Room-temperature chemical welding and sintering of metallic nanostructures by capillary condensation. Nano Lett. 16, 3550-3556 (2016).

[28] Liang, D., Wei, T., Wang, J. & Li, J. Quasi van der Waals epitaxy nitride materials and devices on two dimension materials. Nano Energy 69, 104463 (2020).

[29] Zhang, H. et al. Strain Relaxation in "2D/2D and 2D/3D Systems": Highly Textured Mica/Bi2Te3, Sb2Te3/Bi2Te3, and Bi2Te3/GeTe Heterostructures. ACS Nano 15, 2869-2879, doi:10.1021/acsnano.0c08842 (2021).

[30] de la Mata, M., Magén, C., Caroff, P. & Arbiol, J. Atomic Scale Strain Relaxation in Axial Semiconductor Ill-V Nanowire Heterostructures. Nano Lett. 14, 6614-6620, doi:10.1021/nl503273j (2014).

[31] Bae, S.-H. et al. Graphene-assisted spontaneous relaxation towards dislocation-free heteroepitaxy. Nat. Nanotechnol. 15, 272-276, doi:10.1038/s41565-020-0633-5 (2020).

[32] Liu, Y., Huang, Y. & Duan, X. Van der Waals integration before and beyond two-dimensional materials. Nature 567, 323-333 (2019).

[33] Liao, M. et al. Ultra-low friction and edge-pinning effect in large-lattice-mismatch van der Waals heterostructures. Nat. Mater. 21, 47-53 (2022).

[34] Li, H. et al. Superlubricity between MoS2 monolayers. Adv. Mater. 29, 1701474 (2017).

[35] Rokni, H. & Lu, W. Direct measurements of interfacial adhesion in 2D materials and van der Waals heterostructures in ambient air. Nat. Commun. 11, 5607 (2020).

[36] Burger, J.-C. et al. Analysis of the Growth of Laterally Aligned SnO2 Nanowires by Thermodynamic Considerations and Experiments. Crystal Growth & Design 21, 191-199, doi:10.1021/acs.cgd.0c00983 (2021).

[37] Qiao, J. et al. Few-layer Tellurium: one-dimensional-like layered elementary semiconductor with striking physical properties. Science Bulletin 63, 159-168 (2018).

[38] Qiu, G. et al. Quantum Hall effect of Weyl fermions in n-type semiconducting tellurene. Nat. Nanotechnol. 15, 585-591 (2020).

[39] Ren, X. et al. Gate-tuned insulator-metal transition in electrolyte-gated transistors based on tellurene. Nano Lett. 19, 4738-4744 (2019).

[40] Guo, Y. et al. Additive manufacturing of patterned 2D semiconductor through recyclable masked growth. Proceedings of the National Academy of Sciences 116, 3437-3442 (2019).

[41] Wang, Y., Fedin, I., Zhang, H. & Talapin, D. V. Direct optical lithography of functional inorganic nanomaterials. Science 357, 385-388 (2017).

[42] Conti, S. et al. Low-voltage 2D materials-based printed field-effect transistors for integrated digital and analog electronics on paper. Nat. Commun. 11, 3566 (2020).

[43] Li, D. et al. Ultra-fast photodetectors based on high-mobility indium gallium antimonide nanowires. Nat. Commun. 10, 1664 (2019).

[44] Wang, P. et al. Sensing infrared photons at room temperature: from bulk materials to atomic layers. Small 15, 1904396 (2019).

[45] Rogalski, A., Kopytko, M. & Martyniuk, P. Two-dimensional infrared and terahertz detectors: Outlook and status. Applied Physics Reviews 6, 021316 (2019).

[46] Meng, Y. et al. Perovskite Core-Shell Nanowire Transistors: Interfacial Transfer Doping and Surface Passivation. ACS Nano 14, 12749-12760 (2020).

[47] Meng, Y. et al. Direct Vapor-Liquid-Solid Synthesis of All-Inorganic Perovskite Nanowires for High-Performance Electronics and Optoelectronics. ACS Nano 13, 6060-6070, doi:10.1021/acsnano.9b02379 (2019).

[48] Tong, L. et al. Stable mid-infrared polarization imaging based on quasi-2D tellurium at room temperature. Nat. Commun. 11, 2308 (2020).

[49] Wang, Q. et al. Van der Waals epitaxy and photoresponse of hexagonal tellurium nanoplates on flexible mica sheets. ACS Nano 8, 7497-7505 (2014).

[50] Kang, S. et al. Broad spectral response of an individual tellurium nanobelt grown by molecular beam epitaxy. Nanoscale 11, 1879-1886 (2019).

[51] Lan, C. et al. Direct visualization of grain boundaries in 2D monolayer WS2 via induced growth of CdS nanoparticle chains. Small Methods 3, 1800245 (2019).

[52] Lan, C. et al. Wafer-scale synthesis of monolayer WS2 for high-performance flexible photodetectors by enhanced chemical vapor deposition. Nano Res. 11, 3371-3384, doi:10.1007/s12274-017-1941-4 (2018).

[53] Zhang, X., Shao, Z., Zhang, X., He, Y. & Jie, J. Surface Charge Transfer Doping of Low-Dimensional Nanostructures toward High-Performance Nanodevices. Adv. Mater. 28, 10409-10442, doi:10.1002/adma.201601966 (2016).

[54] Fang, H. et al. Degenerate n-doping of few-layer transition metal dichalcogenides by potassium. Nano Lett. 13, 1991-1995, doi:10.1021/nl400044m (2013).

SUMMARY OF INVENTION

Accordingly, the present invention in one aspect provides a method of fabricating semiconducting tellurium (Te) nanomesh. The method includes the steps of preparing a substrate, vaporizing Te powders under a first temperature; and growing Te nanomesh on the substrate using the vaporized Te powders under a second temperature. The first temperature is higher than the second temperature.

In some embodiments, the substrate includes a curved surface on which the vaporized Te powders are deposited.

In some embodiments, the second temperature is 100° C.

In some embodiments, the first temperature is in the range of 450-500° C.

In some embodiments, the method further includes, between vaporizing step and the growing step, the step of transporting the vaporized Te powders to a surface of the substrate.

In some embodiments, in the transporting step argon gas is used to transport the vaporized Te powders.

In some embodiments, the growing step further includes the steps of nucleating nanoclusters on the substrate, laterally growing the nanomesh, and self-welding the nanomesh.

According to another embodiment of the invention, there is provided a method of creating patterned Te nanomesh. The method contains the steps of pre-patterning photoresist on a substrate; growing Te nanomesh on the substrate; and lifting off the photoresist from the substrate.

BRIEF DESCRIPTION OF FIGURES

The foregoing and further features of the present invention will be apparent from the following description of embodiments which are provided by way of example only in connection with the accompanying figures, of which:

FIG. 2e illustrates a schematic illustration of the self-welding process of Te nanomesh with different growth duration times.

FIGS. 2f1, 2f2 and 2f3 are scanning electron microscope (SEM) images of the self-welding process of Te nanomesh with different growth duration times.

FIG. 3h1 is an optical image of a p-type Te nanomesh TFT (thin-film transistor) fabricated on SiO$_2$ according to one embodiment of the invention.

FIG. 3h2 is a transfer curve of the p-type Te nanomesh TFT fabricated on SiO$_2$ in FIG. 3h1.

FIG. 3h3 is an output characteristic curve of the p-type Te nanomesh TFT fabricated on SiO$_2$ in FIG. 3h1.

FIGS. 4b1, 4b2 and 4b3 are SEM images of the patterned nanomesh made using the process in FIG. 4a, in USAF 1951 resolution test.

FIG. 4e1 is an optical image of an all-nanomesh TFT according to an embodiment of the invention.

FIG. 4e2 is a SEM image of the all-nanomesh TFT.

FIG. 4e3 illustrates transfer characteristic curves of the all-nanomesh TFT.

FIG. 5c is a SEM image of the Te nanomesh PD based on paper substrates.

FIG. 5d1 shows the voltage-current characteristic of photodetection performance of paper-based Te nanomesh PD measured at 1550 nm irradiation with an incident power density of 4 mW/cm$^2$.

FIG. 5d2 shows the time-current characteristic of photodetection performance of paper-based Te nanomesh PD measured at 1550 nm irradiation with an incident power density of 4 mW/cm$^2$.

FIG. 5e1 shows the photoresponse of the paper-based Te nanomesh PD with a chopped frequency of 1 KHz.

FIG. 5e2 shows the photoresponse of the paper-based Te nanomesh PD with a chopped frequency of 10 KHz.

FIG. 5e3 shows the photoresponse of the paper-based Te nanomesh PD with a chopped frequency of 100 KHz.

FIG. 5e4 shows the corresponding high-resolution response of the paper-based Te nanomesh PD with one switching on-off cycle at the chopped frequency of 1 KHz.

FIG. 5e5 shows the corresponding high-resolution response of the paper-based Te nanomesh PD with one switching on-off cycle at the chopped frequency of 10 KHz.

FIG. 5e6 shows the corresponding high-resolution response of the paper-based Te nanomesh PD with one switching on-off cycle at the chopped frequency of 100 KHz.

FIGS. 6c1, 6c2 and 6c3 are HRTEM (High-resolution transmission electron microscopy) images of the Te nanomesh/monolayer $WS_2$ mixed-dimensional heterostructure at different portions thereof.

FIG. 6d1 is a STEM image of the Te nanomesh/monolayer $WS_2$ heterostructures.

FIG. 6d2 is an energy-dispersive X-ray (EDS) mapping of Te of the Te nanomesh/monolayer $WS_2$ heterostructures.

FIG. 6d3 is an EDS mapping of S of the Te nanomesh/monolayer $WS_2$ heterostructures.

DETAILED DESCRIPTION OF PREFERRED EMBODIMENTS

Figure 1A:
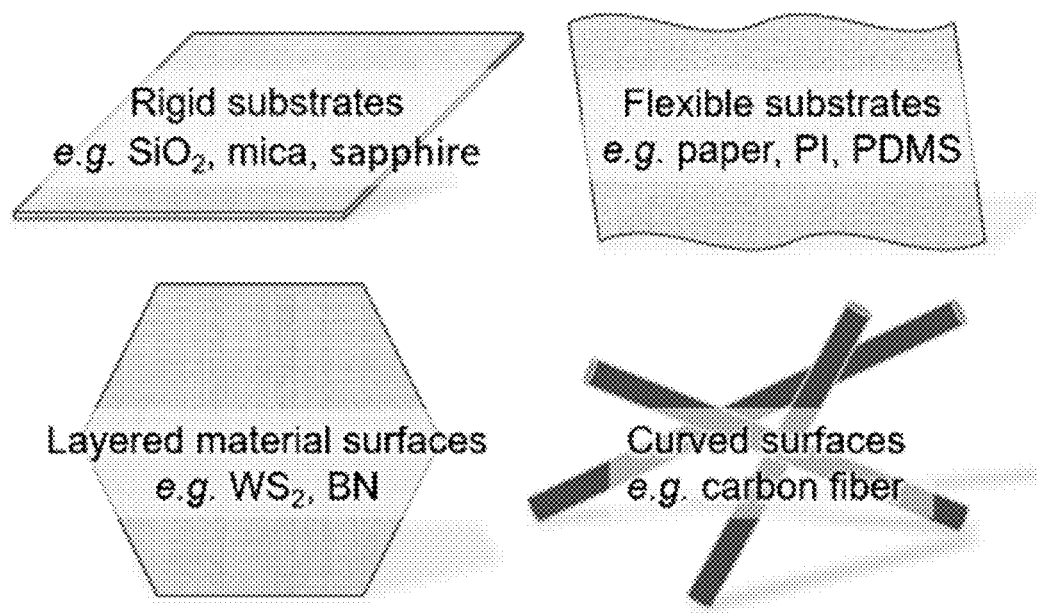
FIG. 1a shows examples of growth substrates that can be used according to some embodiments of the invention with different forms, shapes, and sizes.
Figure 1B:
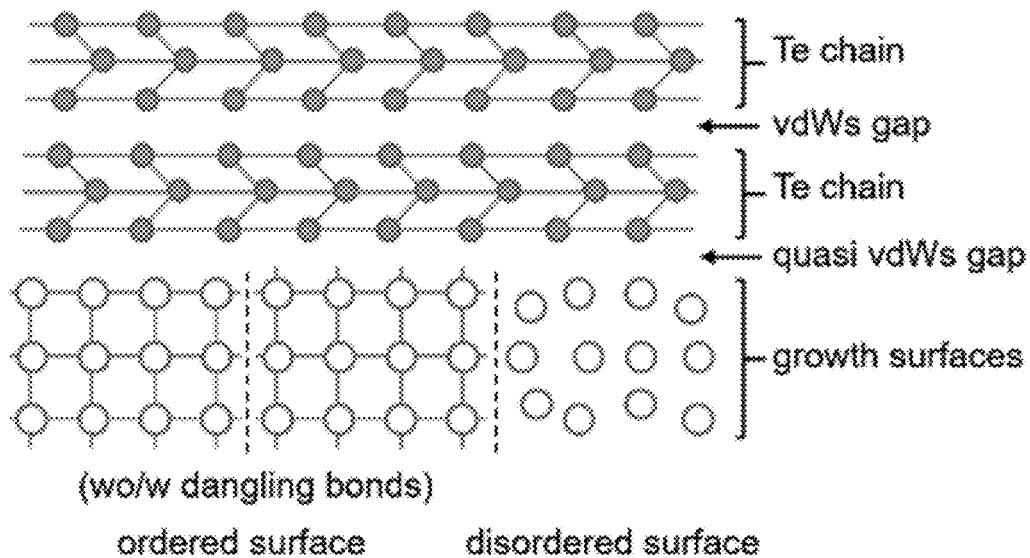
FIG. 1b illustrates multi-scale vdWs interactions of Te molecules on a substrate.
Figure 1C:
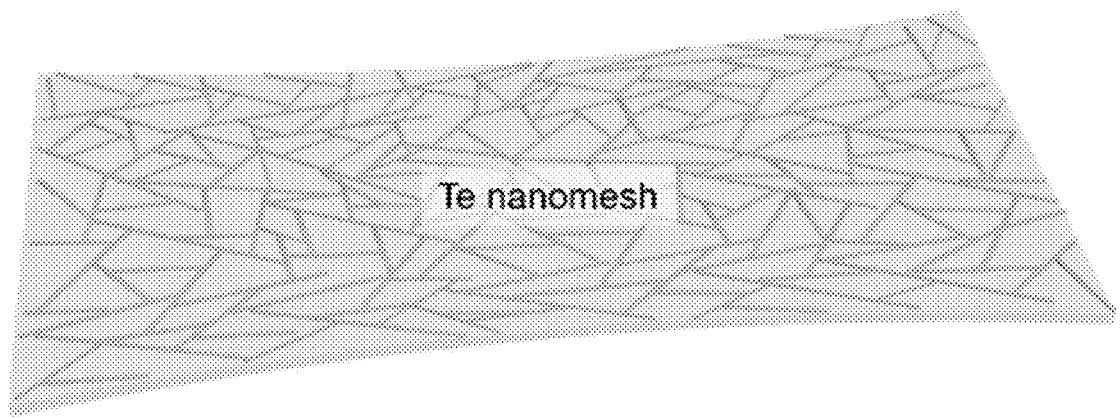
FIG. 1c illustrates low-temperature lateral growth of Te nanowires on heat-intolerant substrates.
Figure 1D:
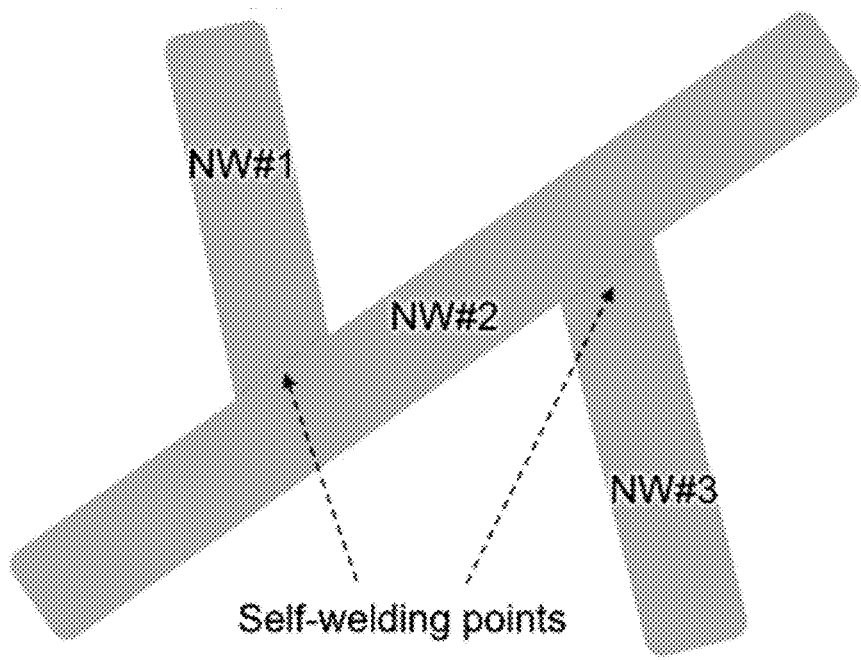
FIG. 1d illustrates self-welding process between Te nanowires to form the Te nanomeshes of FIG. 1c.

Chemical bonds, including covalent and ionic bonds, endow semiconductors with stable electronic configurations, but also impose constraints on their synthesis and lattice-mismatched heteroepitaxy. Directly fabricating well-connected crystalline NW networks (or nanomesh) on target substrates is a possible solution to address all the current challenges on 1D nanomaterials, in which these crystalline nanomeshes have not been explored so far.

Here, the unique multi-scale vdWs interactions are explored in one-dimensional tellurium system to end these restrictions, enabled by the vdWs bonds among Te atomic chains and the spontaneous misfit relaxation at quasi-vdWs interfaces. In one embodiment, wafer-scale Te vdWs nanomesh composing of self-welding Te nanowires are laterally vapor grown on arbitrary surfaces at a low temperature of 100° C., bringing the greater integration freedoms for enhanced device functionality and broad applicability. For instance, a prepared Te vdWs nanomesh as a sample produced according to an embodiment of the invention demonstrates the micrometer-level patterning ability, the high field-effect hole mobility of 145 cm2/Vs, the ultrafast photoresponse below 3 μs in paper-based infrared photodetectors, and the controllable electronic structure in mixed-dimensional heterojunctions. All these device metrics of Te vdWs nanomesh electronics are promising to meet emerging technological demands.

In an embodiment of the invention, the vapor-phase growth of Te nanomesh is developed which is achievable as low as at 100° C. based on the ubiquitous vdWs interactions, and show that the self-welded nanomesh can be reliably grown on arbitrary surfaces. As illustrated in FIGS. 1a-1d, the low-temperature Te nanomesh synthesis offers many attractions in terms of material, process, and device. Firstly, the self-assembled Te nanomesh could be grown on various types of surfaces, including rigid substrates, flexible substrates, layered vdWs material surfaces, and three-dimensional curved surfaces (see FIG. 1a). There is no concern about the compatibility between the target device substrate and the NW growth process; thereby, devices can be made on diverse technologically functional surfaces in a scalable and low-cost manner that cannot be achieved by other means. Secondly, the Te nanomesh synthesis is simply based on the multi-scale vdWs interactions, i.e., the macroscale quasi-vdWs interactions with spontaneous misfit relaxation to substrates[20] and the nanoscale vdWs interactions among Te atomic chains[4] (see FIG. 1b). Unlike the growth mechanisms proposed for metal-catalyzed or epitaxial growth that mainly rely on the complicated liquid-solid interface and epitaxial relationship, the multi-scale vdWs interactions-dominated growth is spontaneous, efficient, and multi-substrate compatible. Thirdly, because all the vdWs interactions explored here are parallel to the growth substrates, the Te NWs would laterally grow on the substrates and then assembly into NW networks. This laterally grown nanomesh is beneficial to the subsequent device integrations, as most present-day devices are fundamentally planar in architectures[5]. Moreover, the low-temperature nanomesh fabrication approach according to an embodiment of the invention, which will be described in more details below, would not involve any chemical reaction and associated damage on typical substrate materials (see FIG. 1c). Therefore, directly growing Te nanomesh on heat-intolerant flexible or stretchable substrates, such as PI and PDMS, is now accessible. Fourthly, a self-welding process is found in the Te nanomesh growth process, which is essential for promoting electrical device performance and mechanical robustness (see FIG. 1d). Compared to the NW networks formed by solution-phase deposition schemes that always give the weak physical inter-NW connection[21], the self-welded nanomesh with well-connected network morphology according to embodiments of the invention is expected to exhibit reduced inter-NW junction resistance and improved mechanical robustness, making them a kind of potentially reliable active device component for practical applications. The rationally designed nanomesh exhibits exciting properties, such as micrometer-level patterning capacity, excellent field-effect hole mobility, fast photoresponse in the optical communication region, and controllable electronic structure of the mixed-dimensional heterojunctions. All these findings are useful to the large-area assembly of functional vdWs nanomesh with potential applications not available by other means.

Figure 1E:
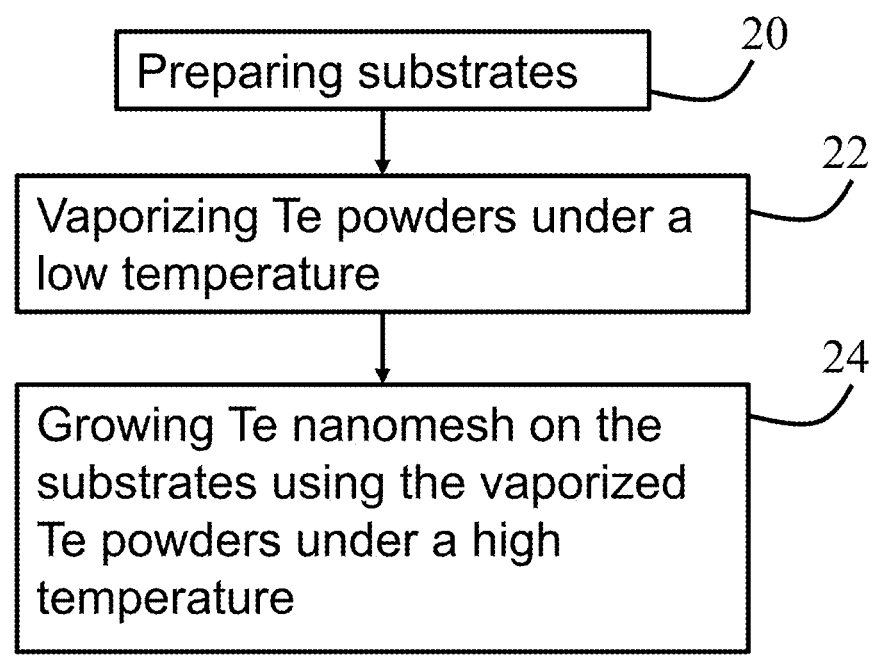
FIG. 1e is a flowchart showing the method of growing semiconducting Te nanomesh according to an embodiment of the invention.

The manufacturing method of Te nanomesh based on low-temperature Te nanomesh growth and according to an embodiment of the invention will be described below. The method can be used to manufacture the Te nanomesh shown in FIGS. 1b-1d, although it should be noted that the Te nanomesh shown in FIGS. 1b-1d may also be manufactured using other methods under the spirit of the invention. Turning to FIG. 1e, the first step of the method is substrate preparation in Step 20. For different types of substrates, the preparation methods could be different, as introduced by way of examples below. For instance, prior to the nanomesh growth, $SiO_2/p^{++}$ Si, sapphire and polyimide substrates are ultrasonically cleaned (in acetone, ethanol, and then deionized water, successively) and dried by nitrogen gas. On the other hand, weighing papers and carbon fibers when used as the substrates can be used as purchased without any cleaning procedures. Furthermore, monolayer $WS_2$ (tungsten disulfide) as used in one embodiment of the invention is grown on sapphire by using the conventional chemical vapor deposition. When BN is used as the substrate, few-layer BN is exfoliated from bulk crystal using 3M© tape and then transferred onto $SiO_2/p^{++}$ Si for further utilization. When mica substrates are used, mica sheets with layered structures are mechanically cleaved into transparent thin flakes before use. To prepare PDMS (polydimethylsiloxane) substrates, silicone elastomer (Sylgard™ 184) is mixed with the curing agent in a weight ratio of 10:1, and then poured into the module to form the 600-μm-thick layers. After that, silicone elastomer films were cured at 70° C. for 4 hours and then 100° C. for 30 min.

Figure 1F:
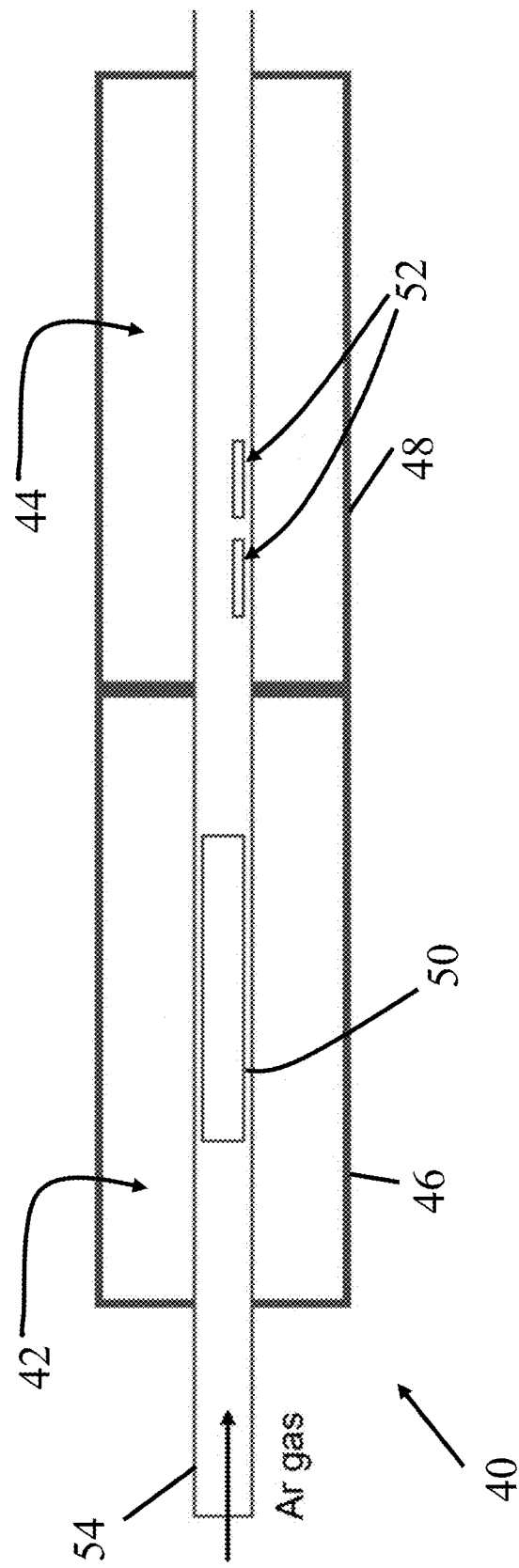
FIG. 1f is a schematic diagram of a two-zone vapor transport system according to an embodiment of the invention.

The second step of the method is Te nanomesh synthesis. The vapor-phase growth of Te nanomesh is carried out in a two-zone vapor transport system 40 as illustrated in FIG. 1*f*. The vapor transport system 40 includes a quartz tube 54 which is used as the transport passage for a transporting gas. According to some embodiments, for a typical growth process a quartz tube with 1-in. inner diameter can be utilized in the vapor transport system, while for the large-area growth, a quartz tube with 2-in. inner diameter can be used instead. Different portions of the quartz tube 54 are located respectively in a high-temperature heating zone 42 and a low-temperature heating zone 44, where the high-temperature heating zone is in front of the low-temperature heating zone 44 in the moving direction of the transporting gas. The high-temperature heating zone 42 is implemented in an interior of a high-temperature heating device 46, and the low-temperature heating zone 44 is implemented in an interior of a low-temperature heating device 48, where the quartz tube 54 extend through both the high-temperature heating zone 42 and the low-temperature heating zone 44.

The operation of the two-zone vapor transport system 40 will now be described. In a preferred embodiment, 1 gram of Te powders 50 (Aldrich, pieces, 99.999%) is placed inside the high-temperature heating zone 42 (450-500° C.), while growth substrates 52 previously prepared in Step 20 of FIG. 1*e* are positioned inside the low-temperature heating zone 42 (100° C.). No metal catalyst is used to seed the NW growth in this embodiment. Before heating, the system 40 is flushed with argon gas (200 sccm) for 30 minutes to remove any possible residual oxygen. To start the nanomesh growth, in Step 22 the Te source powder 50 is vaporized at the setting temperature in the high-temperature heating zone 42. Then, the vaporized Te powders 50 in Step 24 is carried to the low-temperature heating zone 44 by argon gas (50 sccm) and TE nanomesh is grown there. The growth pressure is atmospheric pressure during the entire growth process, avoiding the capital-intensive equipment usually employed in conventional synthesis techniques. The atmospheric pressure is also beneficial to suppress the evaporation of source materials and yield an efficient NW nucleation/growth with uniform morphology. In this embodiment, the NW density ($μm^{-2}$) is calculated from the number of Te NWs making up nanomesh divided by the nanomesh coverage area. The repeated extractions of NW densities over different position of one sample are performed to improve the data accuracy.

After the Te nanomesh is grown on the substrates, the sample morphologies are examined by SEM (field-emission SEM, FEI Quanta 450). In one embodiment, to prepare samples for TEM study (Philips CM-20; HRTEM, JEOL 2100F; HAADF-STEM, JEM-ARM300F2), the Te nanomesh and Te nanomesh/$WS_2$ heterostructure are transferred onto the Cu grids using a conventional polymer-based wet-transfer method. An EDS detector attached to JEOL 2100F is utilized to perform elemental mappings. A Philips powder x-ray diffractometer (XRD) is used to determine the crystal structures. The PL spectra is acquired by F-4600 FL spectrophotometer with an excitation wavelength of 532 nm. To study the chemical states of samples, X-ray photoelectron spectroscopy (XPS, Thermo ESCALAB 250Xi system) is employed. The Raman study was done by a NTEGRA Spectra system (NT-MDT). The contact angles of water drop on various substrates are performed using a DataPhysics OCA 15EC Contact Angle Tester. Cross-sectional $Te/SiO_2$ sample is prepared by focused ion beam (FIB, FEI Scios Dual Beam system), and then STEM characterizations are conducted on atomic-resolution JEM-ARM300F2 operating at 300 KV. In situ friction property tests are performed with a Hysitron PI85 SEM PicoIndenter equipped on SEM (FEI Quanta 450 FE-SEM). Displacement control mode with a constant loading velocity of 20 nm/s are used during loading. The load-displacement data can be recorded from the nanoindenter, meanwhile the sample displacement was recorded via in situ SEM imaging. Details of the above material characterization steps will be described later with reference to samples obtained using methods according to embodiments of the invention.

Figure 2A:
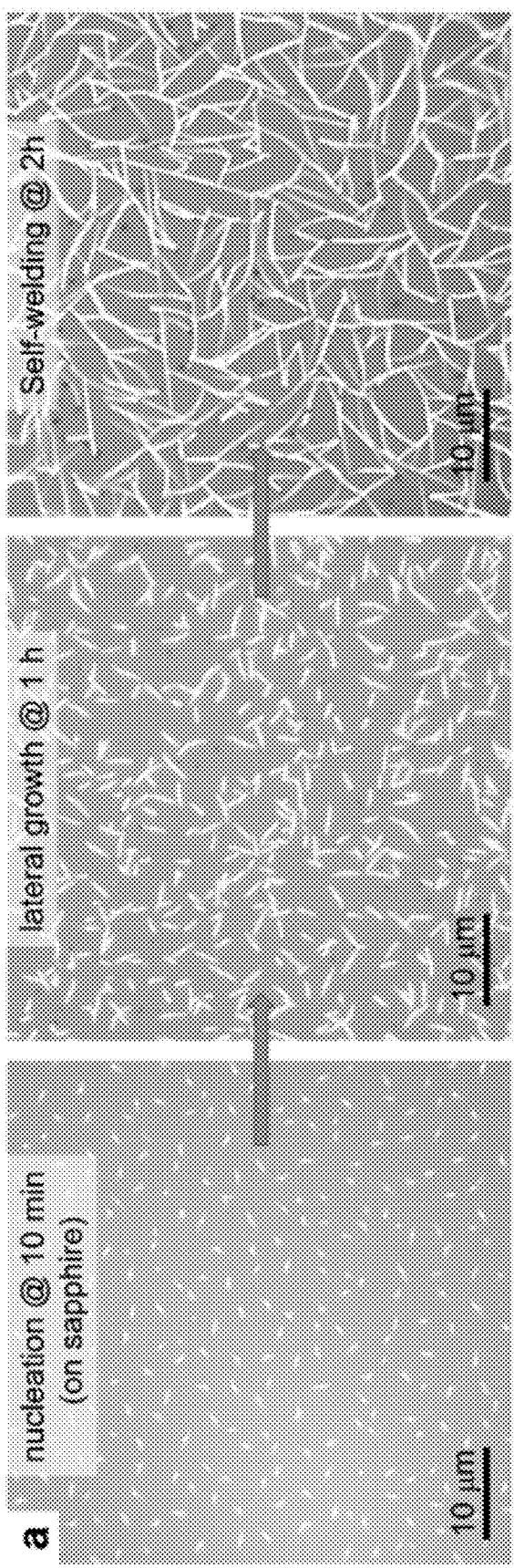
FIG. 2a illustrates optical images of Te nanomesh grown on sapphire with different growth durations, showing nucleation, lateral growth, and self-welding steps, according to some embodiments of the invention.

The geometric control and self-welding process during the Te nanomesh growth will now be discussed. Taking sapphire substrates as an example, FIG. 2*a* shows nucleation, lateral growth and self-welding steps of Te NWs that occur sequentially through the entire growth process. To start with, Te molecules randomly diffuse on the growth surface and reach an active surface site (steps, defects, impurities, etc.) that is energetically favorable for nucleation[22]. As the densities of active surface sites depend on the substrate type and quality, enhanced nucleation densities on roughened surfaces are observed because of their increased surface defects, as shown in FIG. 2*c*. In specific, the nucleation densities on PDMS and photoresist film are found to be 4.5±0.2 $μm^{-2}$ and 3.5±0.2 $μm^{-2}$, respectively, significantly higher than those on some surface-clean substrates (e.g., 0.12±0.09 $μm^{-2}$ of $SiO^2$ and 0.45±0.15 $μm^{-2}$ of sapphire). Besides, because of the pronounced atomic-chain crystal structure, the Te atoms are more strongly coupled with each other in an atomic chain than with the growth substrate. Although with distinctly different substrate features, Te nanomesh on both rigid and flexible substrates show basically similar growth behaviors. Following the Volmer-Weber nucleation model[23,24], the nanoclusters are nucleated and grown directly on the substrate surface, regardless of the surface features, giving rise to the general growth of Te nanomesh on diverse substrates.

To substantiate the correlation between nucleation density and substrate quality, the contact angle measurements on various vacant substrates is performed. The contact angle could provide quantitative data about the molecular differences in surface energy (see FIG. 2*c*). In general, the active surface sites would create a low energy surface, lowering the energy barrier for nucleation. Indeed, enhanced nucleation densities are observed on surfaces with low surface energies (see FIG. 2*c*). This finding allows modifying the NW density of Te nanomesh via surface energy engineering. The control experiments are demonstrated to endorse the proposed correlation (see FIG. 2d). For instances, to increase the NW density on certain substrates, HF-treated $SiO_2$ (changing terminated groups), 1000° C.-annealed sapphire (creating steps), Ar plasma-bombarded PI (increasing roughness) are also conducted to lower the corresponding surface energies. On the contrary, enhancing the surface energy of $SiO_2$, by removing surface carbon contaminants via $O_2$ plasma treatment, would lead to the decreasing NW density. These results are in good agreement with the proposed surface energy-determined nucleation density correlation, and also specify some defects/impurities that could directly trigger the nucleation and growth of Te NWs, including surface groups, steps, and contaminants.

Figure 2B:
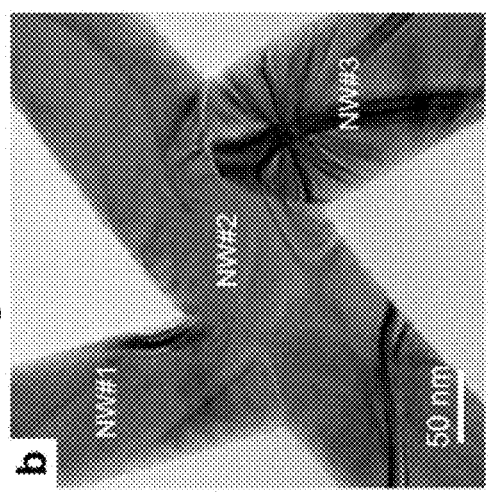
FIG. 2b illustrates transmission electron microscopy (TEM) images of Te nanomesh with distinct self-welding regions.
Figure 2C:
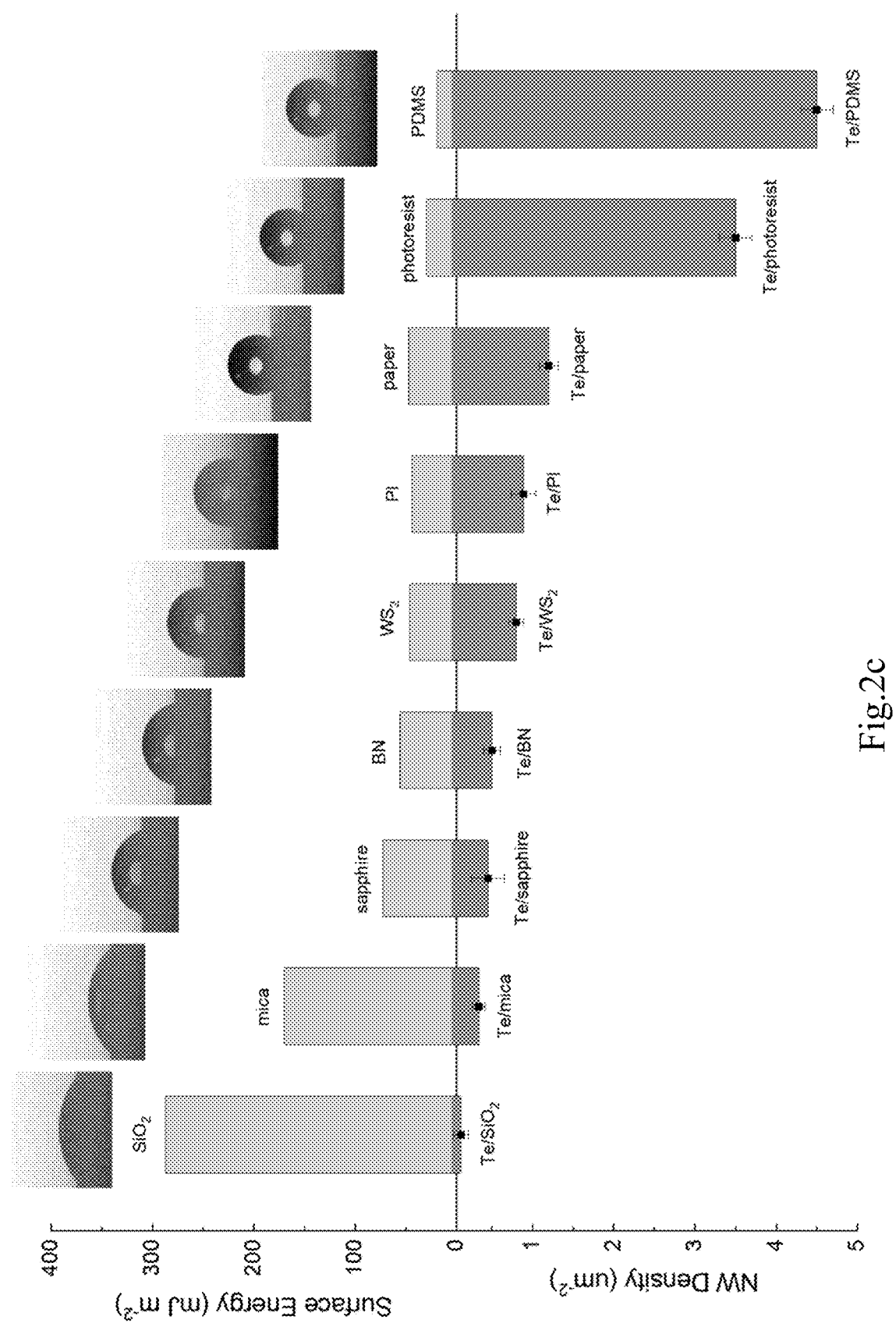
FIG. 2c illustrates surface energies of different exemplary substrates and corresponding NW densities of Te nanomesh after growth. Insets show photographs of water droplets on the different substrates.
Figure 2D:
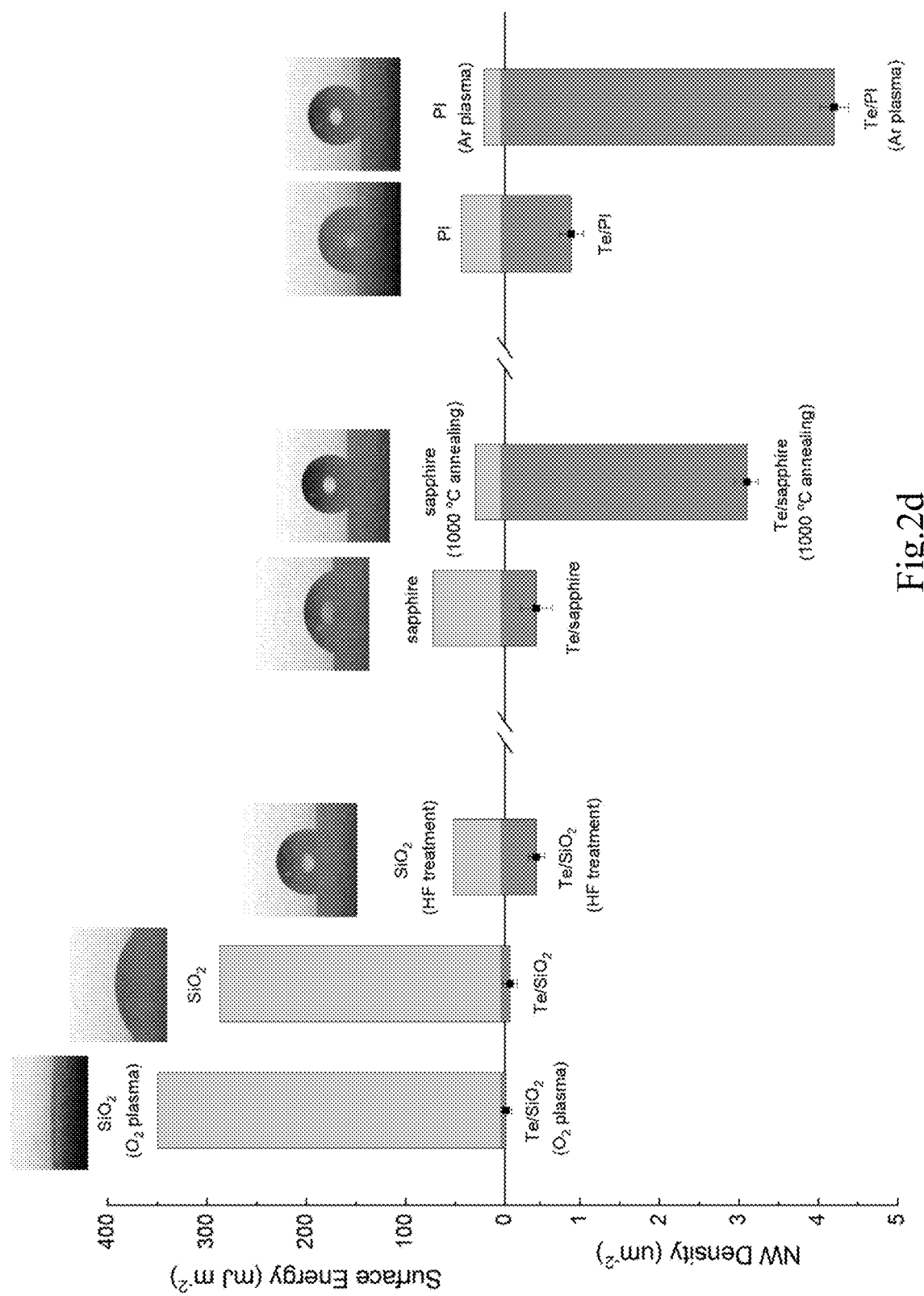
FIG. 2d illustrates surface energies of different substrates before/after surface treatments and the corresponding NW densities of Te nanomesh after growth.

With a continuous supply of Te adatoms, the lengths of Te NWs are increasing with the growth time, while at the same time the NW diameter is relatively constant (~150 nm) (see FIGS. 2a and 2b). This result reveals that the Te incorporation in the radial direction and axial direction of Te NWs is significantly different. From TEM images and selected area electron diffraction (SAED) patterns, single crystallinity and growth orientation of <0001> for the Te NWs are distinguished. The favored <0001> growth of the Te NW is mainly owing to the highly anisotropic crystalline structure of Te, agreeing well with the reported works[4,22]. The covalently-bonded Te atoms along the c-axis have higher binding energy (0.68 eV) than those along the <$\bar{1}2\bar{1}0$> (0.22 eV) and <$10\bar{1}0$> (0.05 eV) directions[22]. Therefore, in a continuous adsorption and desorption process, driven by the stronger bond in <0001> directions, the growth along the c-axis (i.e., the NW axial direction) is kinetically favored, while the growth along radial direction almost stop with a constant diameter of 150 nm. Changing local energetic landscape with growth temperatures would directly affect the NW morphology, including diameter, length, and density. With decreased growth temperatures from 200° C. to 50° C., the Te NWs possess increased density, but decreased length and decreased diameter from ~3 µm to ~20 nm. For benchmarking with the state-of-the-art ultrathin inorganic chains, future NW scaling with significantly reduced NW diameter could be realized by growth optimization and subtractive manufacturing (e.g., etching and exfoliation).

By increasing the growth time to 2 hours or above, Te NWs extend to connect each other, and the self-welding processes appear at the inter-NW junctions (see FIG. 2e). The atomic-sharp boundary formed between two neighboring Te NWs confirms the self-welding process of Te nanomesh. The welding angle is random without specific values, as there have no coherence and lattice epitaxy relationship between NW and substrate. From the HRTEM study on the welding point of two NWs, the welding angle is consistent with their contact angle determining by their growth orientations. As for the self-welding mechanism, this could be understood as two microstructures are closely contacted with each other, a spontaneous vapor condensation occurs, followed by a welding point formation at the contact area. To better understand the self-welding process in this work, schematic illustration (FIG. 2e), SEM images (FIGS. 2f1-2f3), and TEM images are displayed with different growth duration times. Compared to the 2~3 hours-grown nanomesh, the enlarging soldering points and the thicker NW body are clearly observed with prolonging growth durations above 4 hours due to the additional preferred vapor condensation, showing the dramatically improved welding status and thus better electrical properties. This is consistent with the reported experiments[25] and simulations[26] that the microstructures with small curvatures or nanoscale gaps would be the preferred sites for vapor condensation. The vapor condensation-induced welding process has been proposed to enhance the conductivity as well as mechanical strength of solution-processed metal NW networks[27].

The compositional purity and hexagonal structure are also carefully evaluated by XRD, EDS, and Raman study in detail. All these results can evidently indicate the excellent material properties of Te nanomesh, together with the well-defined NW morphology and uniform nanomesh assembly. Importantly, the XRD patterns of Te nanomesh illustrate the unaltered hexagonal-phase diffraction peaks, both in peak intensities and peak positions, even remaining unchanged for storage in ambient conditions for 300 days. While fabricated into transistors, the device performances show no discernible degradation in output current or mobility after 50-days storage in ambient, even without device encapsulation. These observations highlight the superior environmental stability of Te nanomesh against environmental factors (e.g., moisture and atmospheric oxygen), which is highly desired for practical applications. The naturally terminated dangling-bond-free surfaces of vdWs nanomesh play a key role in blocking the surface-induced material degradation commonly observed in typical nanoscale semiconductors[16].

The multi-scale vdWs integration will now be discussed. It is postulated that the multi-scale vdWs interactions, i.e., the macroscale quasi-vdWs interactions to substrates[20] and the nanoscale vdWs interactions among Te chains[4], dominate the growth process of Te nanomesh. Unlike ionic or covalent bonds, the vdWs forces (or vdWs interactions) exist between the neighboring atoms, molecules and surfaces ubiquitously. In individual atomic-chain Te NWs, the nanoscale vdWs interactions between adjacent chains would promote the anisotropic growth of NWs along the chain direction. Moreover, since most growth substrates used in this work are three-dimensional materials with reactive dangling bonds while the Te NW surface is free of dangling bonds, the binding mechanism between such dissimilar materials is referred to quasi-vdWs interactions[20,28]. To shed light on the atomic structure of such quasi-vdWs interface, high angle annular dark field scanning transmission electron microscopy (HAADF-STEM) is conducted on a Te NW/$SiO_2$ interface in cross-sectional view. As shown in the HAADF-STEM image (see FIG. 3a), spiral Te atomic chains are oriented along the c-axis of hexagonal array, together with the distinct interface to $SiO_2$. The intensity profile is analyzed to show the ($\bar{1}2\bar{1}0$) plane spacing in FIG. 3b. Interestingly, the first plane spacing at the interface is 5.01 Å, being significantly larger than the normal bulk plane spacing of 4.62 Å.

In general, strain can relax by plastic deformations or elastic dislocations, in a short range or a long range.[29,30] In exemplary embodiments of the invention, the strain induced by the interfacial lattice mismatch is substantially eliminated within one nm (i.e. two vdWs blocks) near interface (see FIG. 3c) via the re-configuration of Te chain spacings, indicating an abruptly interfacial relaxation of the misfit strain, i.e., short-range plastic deformations.[29] This is in contrast to the conventional heteroepitaxy in lattice-mismatched systems, where the misfit strain relaxes gradually via the introduction of bulk dislocations to release the accumulated elastic energy, i.e., long-range elastic dislocations[31]. Considering the strength of weak quasi-vdWs interaction (0.1-10 kJ/mol) is about two or three orders of magnitude less than that of chemical bonds (100-1,000 kJ/mol),[32] the immediate strain relaxations happened at the quasi-vdWs interface efficiently through short-range plastic deformations, other than the formation of long-range elastic dislocations within NW bulk. The spontaneous near-interface relaxations induced by the weak quasi-vdWs interaction may enable the general growth of Te nanomesh on various substrates.

Superlubricity phenomenon has been widely found in vdWs interfaces, featuring as the ultra-low coefficient of friction (COF) below $10^{-3}$, enabled by their weak vdWs interactions and natural lattice mismatch.[33] Here, the frictional properties between Te NW and $SiO_2$ growth substrate were studied (see FIG. 3d), by which a direct experimental evidence for the vdWs interaction-induced superlubricity was found. The friction property test on $Te/SiO_2$ can be achieved by the lateral movements of diamond nanoindenter to push the Te NW, where a displacement control mode with a constant loading velocity of 20 nm/s is used. Evidently, both static friction process and sliding friction process are observed in FIG. 3e, where the friction force ($F_f$) is up to 75 µN. The cohesive force (N) is mainly contributed by the vdWs interface energy, which can be calculated by $N=\sigma S/A$,[34] where σ is interfacial adhesion energy with the typical values of 0.1~0.4 J $cm^{-2}$,[35] S is the contact area of 200 µ$m^2$, and A is the interaction distance of 0.2 Å between Te NW and substrate. As a result, the $COF=F_f/N$ is estimated to be $3.7\pm1.5\times10^{-4}$, being comparable to most vdWs materials and their heterostructures (see FIG. 3f). On the macroscopic scale, the typical peel off process of Te nanomesh from different growth substrates to target substrates is demonstrated, also highlighting the macroscale quasi-vdWs interactions of Te nanomesh/substrates. These results directly prove the low-energy quasi-vdWs interaction between Te nanomesh and growth substrates.

Overall, the multi-scale vdWs interactions, from the macroscale self-assembly to the nanoscale chain conformation, are fundamentally different from the growth mechanisms proposed for metal-catalyzed growth or epitaxial growth. The quasi-vdWs interactions with spontaneous misfit relaxation are also different from the conventional van der Waals epitaxy (vdWE) growth, in which the chemically inert surface needs to be dangling bonds free or be terminated regularly[32]. In contrast to that, different surfaces, either with or without dangling bonds, are capable of Te nanomesh growth according to embodiments of the invention. Equally importantly, as both macroscale and nanoscale vdWs interactions are parallel to the growth substrates, the Te NWs would laterally grow on the substrates and further facilitate the subsequent self-welded nanomesh formation for extended applications. With thermodynamic considerations, the energy minimizations also play a key role in determining the lateral Te NWs growth on substrates.[36] Here, because the packed Te molecular chains are in the plane of the growth substrates, the (0003) diffraction peak is absent in the XRD patterns.

Figure 3A:
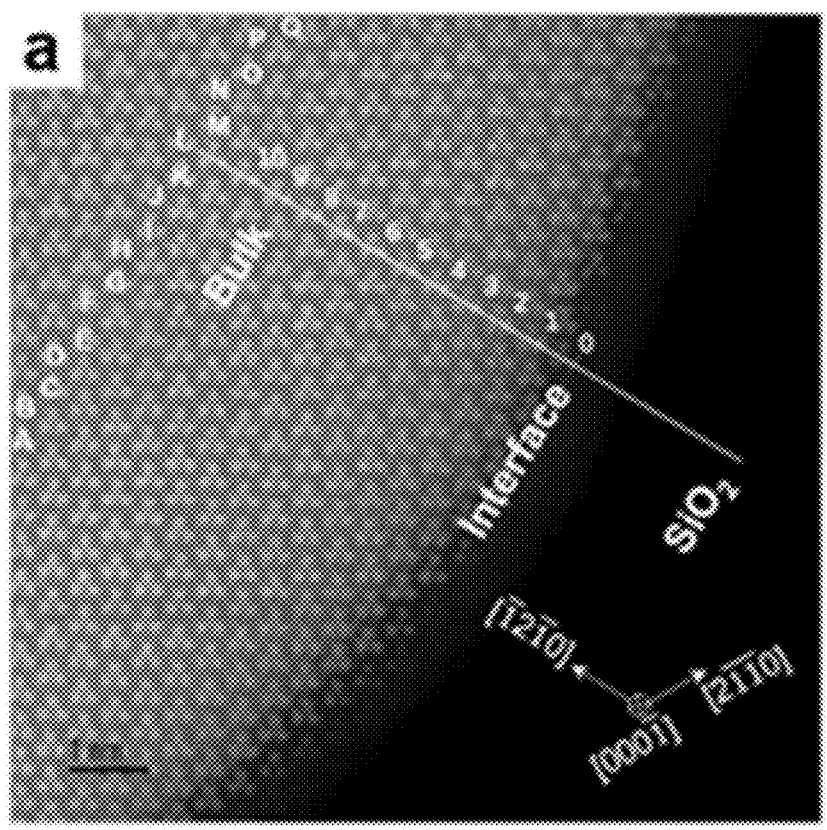
FIG. 3a shows a cross-sectional HAADF-STEM (high-angle annular dark-field scanning transmission electron microscopy) image of a Te NW/SiO$_2$ according to one embodiment of the invention.
Figure 3B:
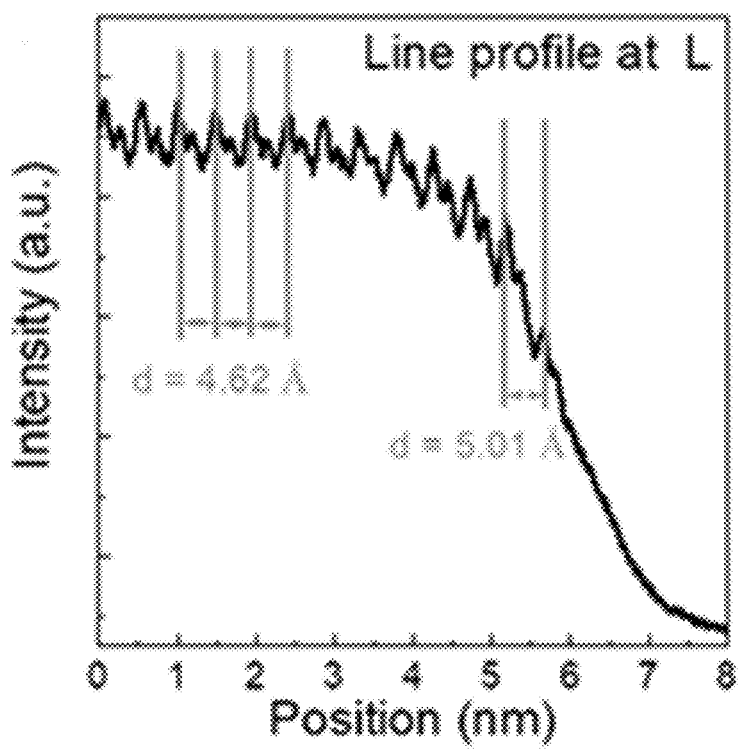
FIG. 3b illustrates a line intensity profile located at L position in the HAADF-STEM image.
Figure 3C:
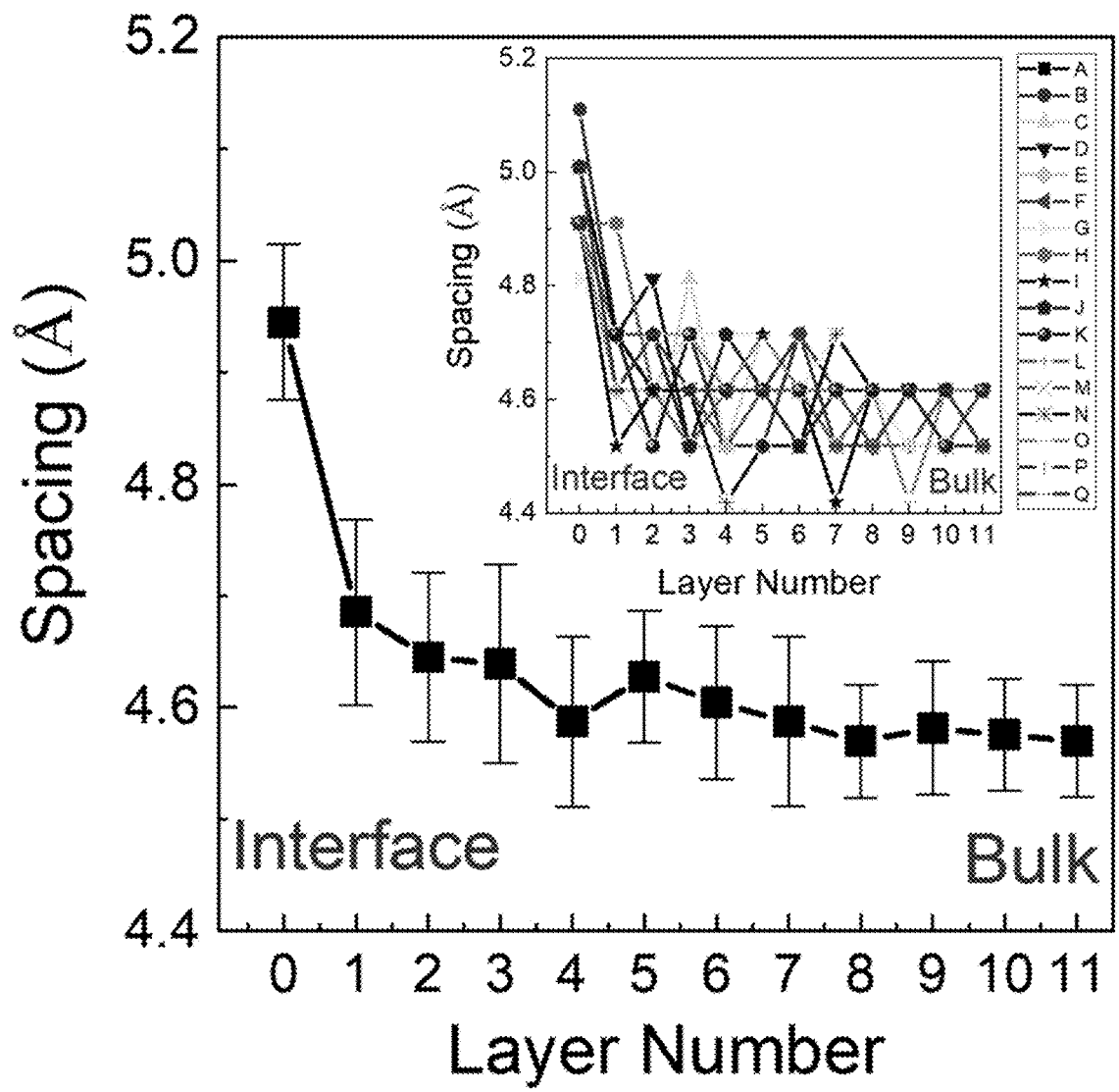
FIG. 3c shows average plane spacing of ($\bar{1}2\bar{1}0$) as a function of layer number ranging from interface to bulk.
Figure 3D:
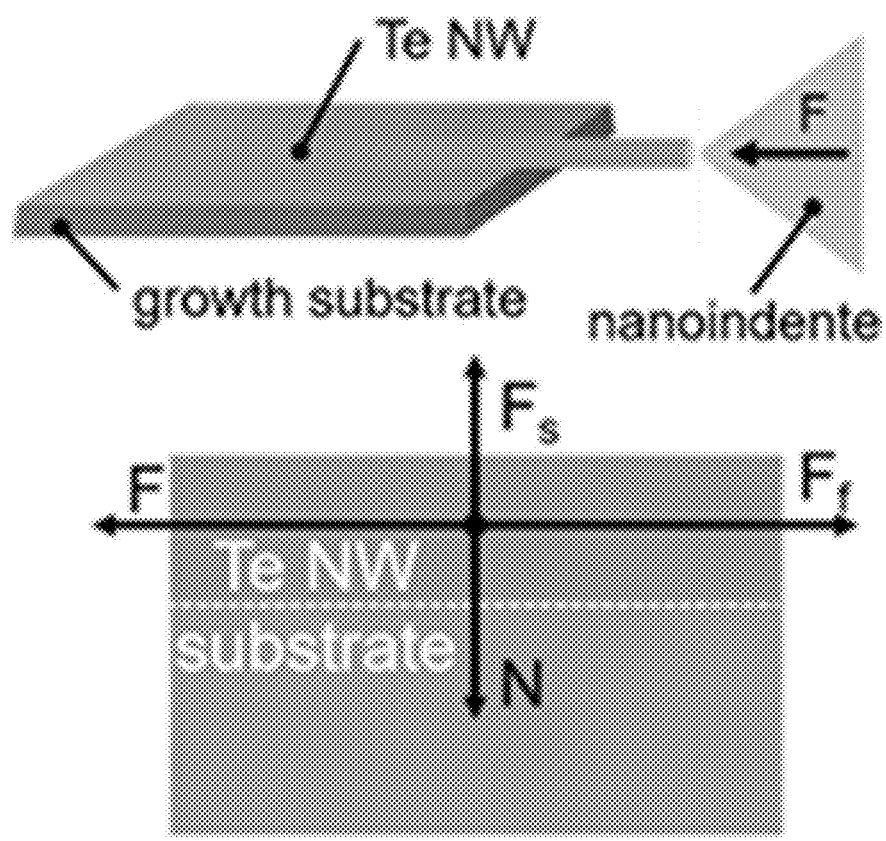
FIG. 3d is a schematic illustration of the friction property test.
Figure 3E:
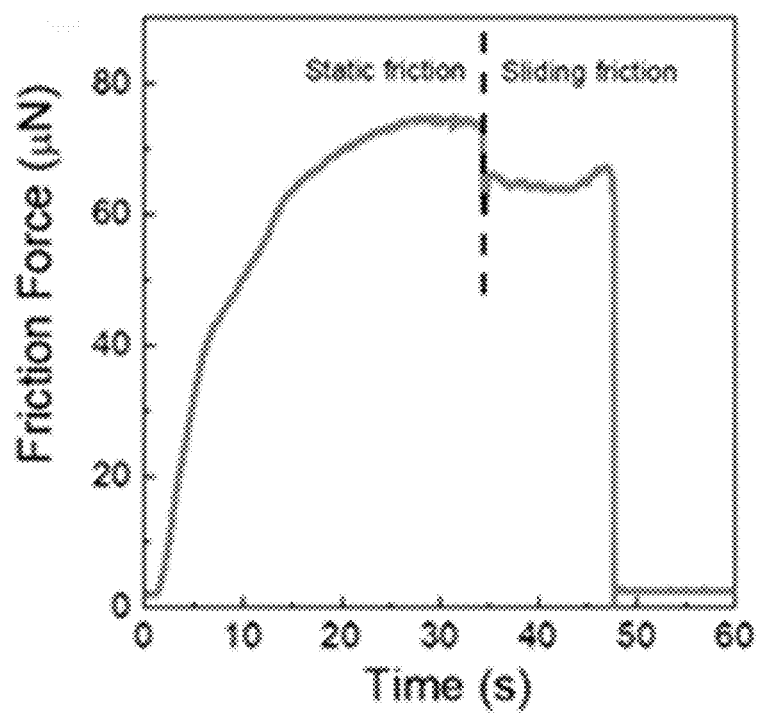
FIG. 3e illustrates a corresponding friction force measured in the friction property test.
Figure 3F:
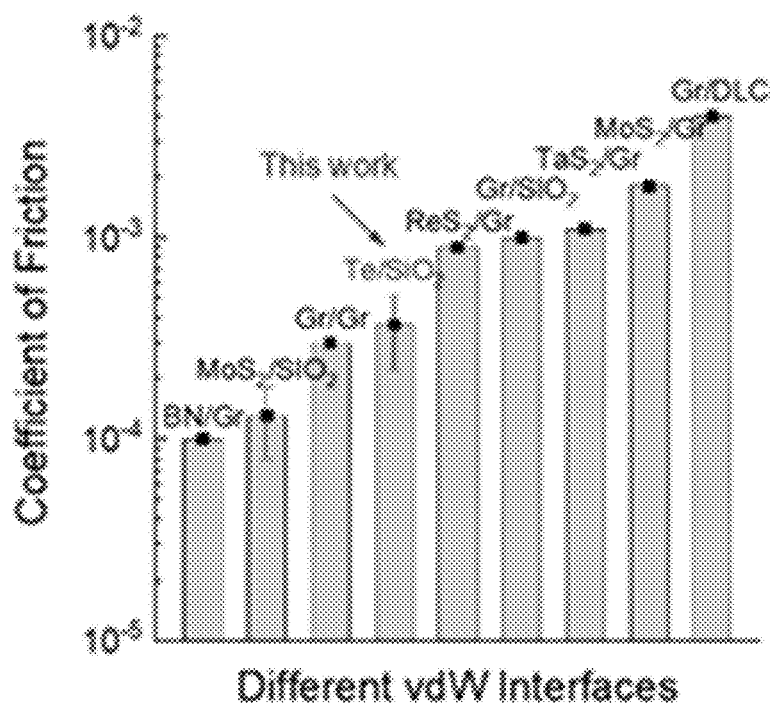
FIG. 3f is a comparison chart of the coefficient of friction of various vdWs interfaces.
Figure 3G:
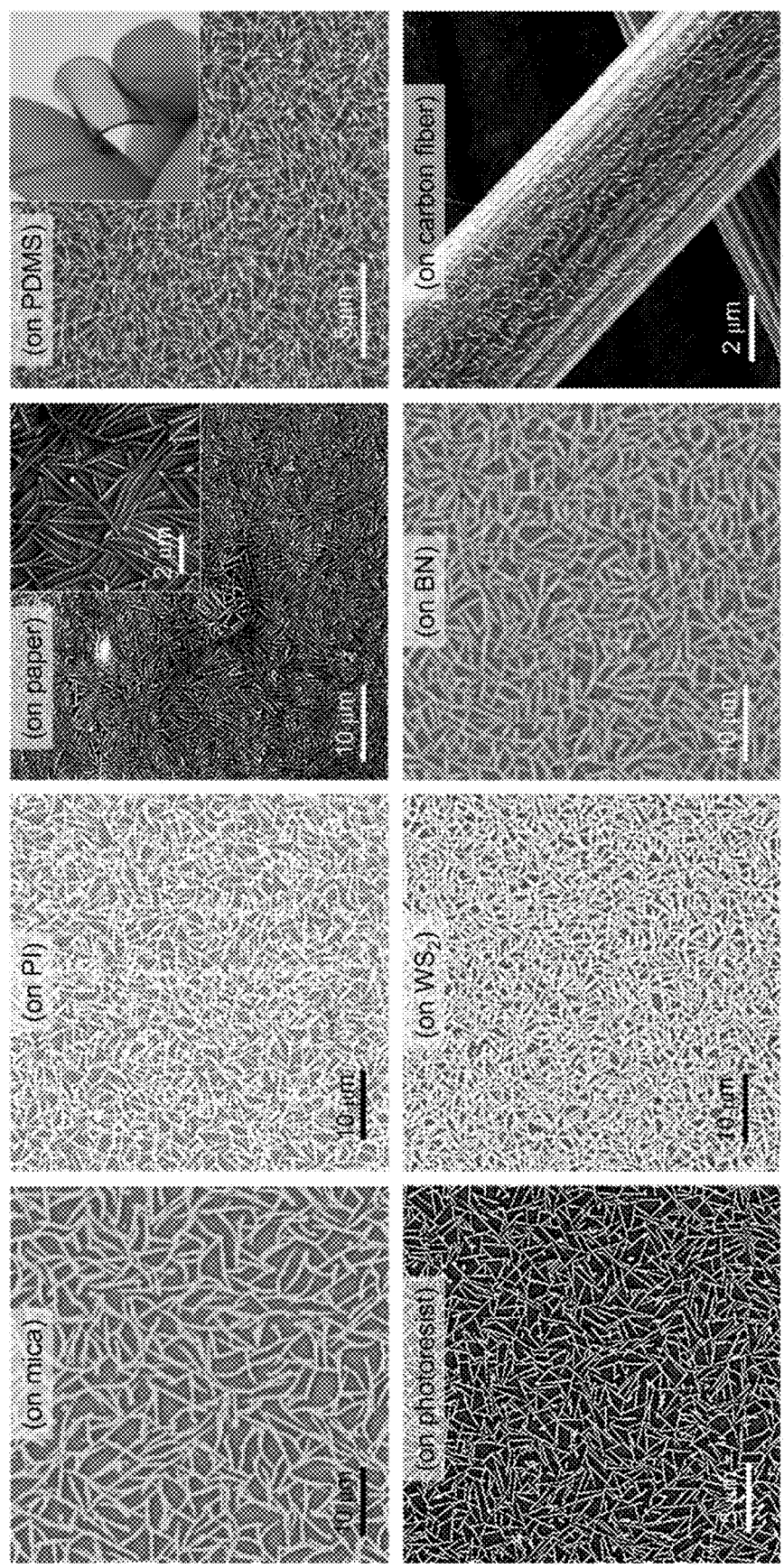
FIG. 3g includes optical and SEM images of Te nanomesh grown on different surfaces including mica (optical), polymide (PI) (optical), weighing paper (SEM), polydimethylsiloxane (PDMS) (SEM), photoresist (SEM), WS$_2$ (optical), boron nitride (BN) (optical), and carbon fiber (SEM), in some implementations of the invention.

In order to show the universality of nanomesh methodology, direct forming of self-welded Te nanomesh on various types of surfaces is demonstrated in FIG. 3g, including rigid substrates (e.g., $SiO_2$, sapphire, and mica), flexible substrates (e.g., paper, PI, and PDMS), layered 2D material surfaces (e.g., tungsten disulfide and boron nitride), and three-dimensional curved surfaces (e.g., carbon fibers). These implemented substrates are across different categories regarding whether they are ordered or disordered, rigid or flexible, bulk or layered surface, flat or curved, etc. Specifically, the direct Te nanomesh growth on heat-intolerant substrates are successfully realized with a temperature as low as 100° C., completely unattainable by other vapor growth methods of 1D nanomaterials. Moreover, the unique capability of multi-substrate compatible growth is also used to grow nanomesh on carbon fibers, a kind of curved substrate (see FIG. 3g). This multi-substrate compatible growth is difficult to be achieved by the post-synthesis assembly of NW networks relying on mechanical assembly or solution-phase deposition schemes. This multi-substrate compatible growth is difficult to be achieved by the post-synthesis assembly of NW networks relying on mechanical assembly or solution-phase deposition schemes[5]. The relationship between crystallinity and electrical properties of the obtained Te nanomesh on different substrates were also studied, where their crystallinities and conductivities of Te nanomesh witness a decreasing trend from $SiO_2$, mica, sapphire, polyimide to paper. Afterward, the synthesis scalability is also investigated by employing a vapor transport system equipped with a 2-inch quartz tube. As a result, wafer-scale Te nanomesh is reliably yielded on different kinds of substrates. Anyway, despite the significantly different surface forms, shapes, and sizes, all these substrates are fully covered by the well-connected nanomesh after growth, further highlighting the versatility of vdWs nanomesh for different utilization.

The P-type transport properties of Te nanomesh will now be discussed. Apart from the low-temperature synthesis on arbitrary substrates, it is important to evaluate the charge transport characteristics of Te nanomesh. In this case, thin-film transistors (TFTs) based on Te nanomesh are fabricated on the $SiO_2/p^{++}$ Si (50 nm thick thermal oxide) substrates (see FIGS. 3h1-3h3). To complete the bottom-gate top-contact device structure, the 5/80-nm thick Cr/Au electrodes defined by shadow masking are adopted as the source/drain electrodes. The extracted contact resistance is 2.5±0.4 Ω·mm at a gate overdrive voltage of −12 V by using a transfer length method. From the transfer and output characteristic curves of Te nanomesh TFTs, the conductance of the nanomesh channel is effectively modulated by the gate bias voltage (see FIGS. 3h1-3h3). Because of the gate screening effect, typical asymmetric transfer curves when applying positive and negative source-drain ($V_{ds}$) voltage are found in the p-type Te nanomesh TFTs. Due to the same reason, the output curves show the obvious saturation behavior at large negative $V_{ds}$, while upon a positive $V_{ds}$, the device does not show the sign of saturation.

When operating in the linear regime, the Te nanomesh TFT demonstrates excellent p-type transistor performance with a peak field-effect hole mobility of 145 $cm^2/Vs$. This mobility is comparable or even better than conventional p-type semiconducting thin-film devices, including metal oxides, metal halides, perovskite halides, organic materials, and CNT thin films. From the statistical analysis of 20 devices (4×5 arrays) on the same wafer, the on-current of 7.5±1.2 mA/mm, the threshold voltage of 1.8±0.3 V, and the peak hole mobility of 145±15 $cm^2/Vs$ are obtained, further proving the excellent uniformity of nanomesh TFT performance. These outstanding hole mobility and high current-carrying capacity are mainly attributed to the single-crystalline nature of individual Te NW and the good electrical connections between self-welded NWs.

Based on a rationally designed vdWs nanomesh deposition method, the morphologies of Te nanomesh could be controlled in some embodiments of the invention, which would in turn boost the device performances including mobility and output current to a promising level. To better show the growth control and corresponding device performance optimization, the related experiments were carried out as a function of different substrate selections, deposition temperatures, and growth durations. With the tunable diameter, length, density, and welding status of Te nanomesh, one could obtain a powerful platform to obtain an on/off current ratio of ~$10^3$ and a hole mobility up to 195 $cm^2/Vs$. The obtained hole mobility value outperforms all the scalable Te-based materials, like the evaporated Te thin films of 35 $cm^2/Vs^{17}$ and $Te_xSe_y$ thin films of ~40 $cm^2/Vs^{18}$, but lower than some single Te nanostructure, like solution-grown 2D Te layers of 700 $cm^2/Vs^{15}$ and 1D Te NW encapsulated in nanotube of 600 $cm^2/Vs^4$. This result is reasonable when considering wafer-scale coverage and inter-NW connections among nanomesh. It is worth mentioning that the theoretical mobilities of Te materials in literature are up to ~$10^5$ $cm^2/Vs^{37}$, arising from the narrow bandgap and low effective mass. Thus, there is still ample spacing to boost further the mobility of Te nanomesh with various strategies, such as surface doping[38], composition design[18], and dielectric engineering[39].

Figure 4A:
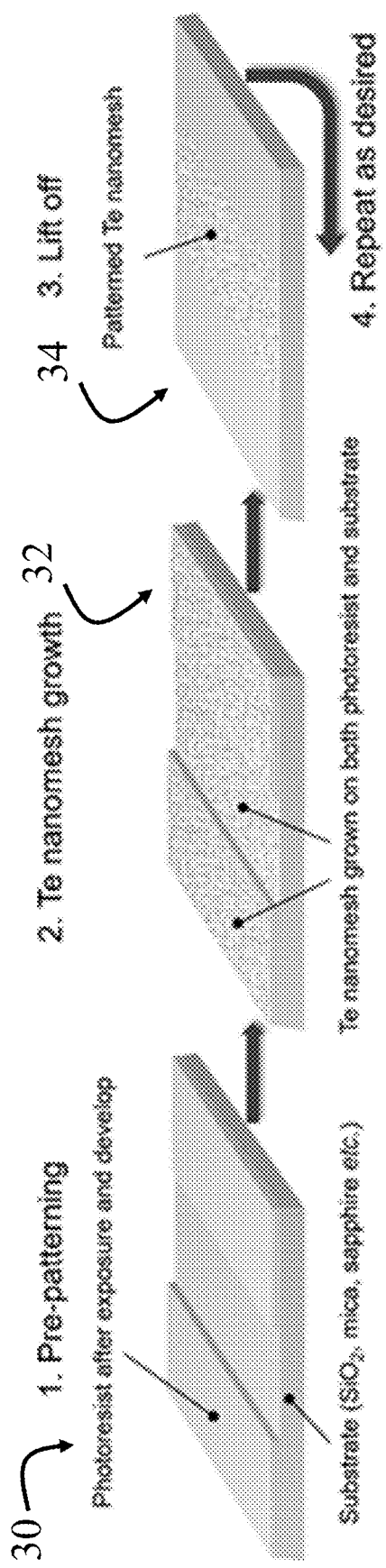
FIG. 4a includes schematic illustrations of a Te nanomesh patterning process according to one embodiment of the invention.
Figure 4A:
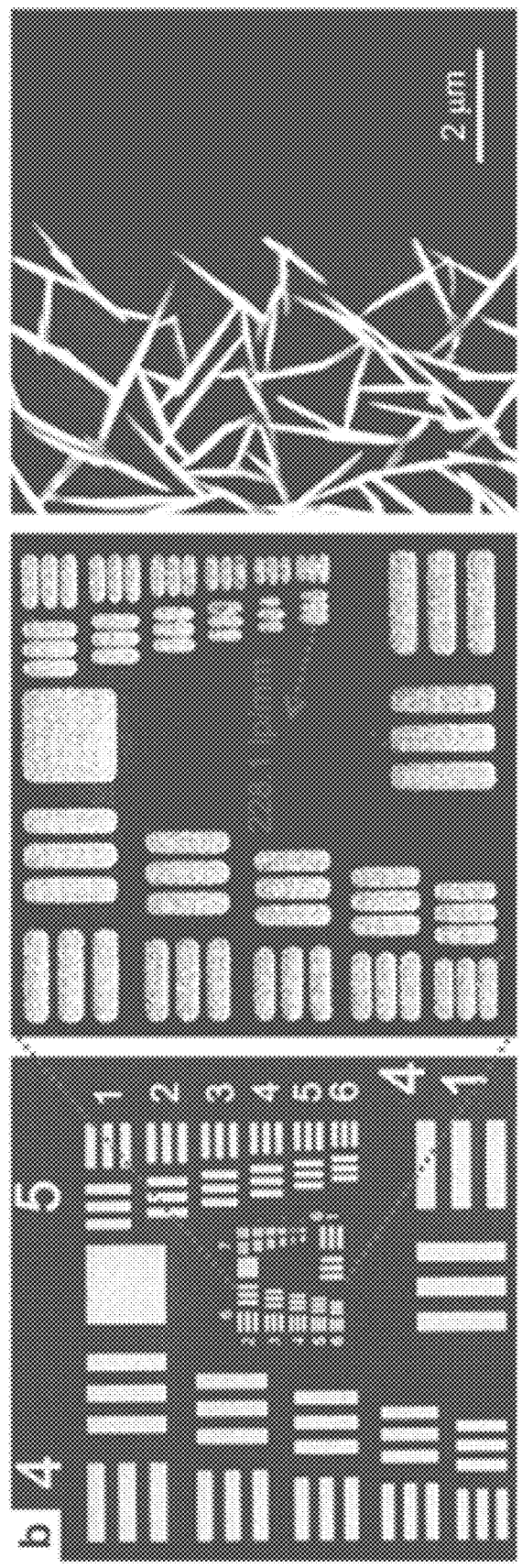

A high-resolution nanomesh patterning process according to another embodiment of the invention will now be described. Microscale patterning is a fundamental step in the implementation of nanomaterials for practical devices. Traditional macroscale integration of crystalline NWs via conventional patterning methods usually suffers from low resolution and poorly defined pattern edges. In this embodiment, a nanomesh patterning process with a micrometer-level resolution is successfully demonstrated by combining the multi-substrate compatible nanomesh growth and photolithography process (see FIG. 4a). First, in Step 30 patterned photoresist films are generated using a standard exposing/removing process. Taking advantage of the multi-substrate compatible growth, in Step 32 Te nanomesh are grown on both the pre-patterned photoresist film and the photoresist-uncovered $SiO_2$ substrates simultaneously, for example using the method illustrated in FIG. 1e. After the nanomesh growth, the patterned photoresist film and the nanomesh on it were removed at the same time through a lift-off process, as shown by Step 34. Finally, the nanomesh grown on the uncovered substrates is remained to project the microscale images onto a wafer as designed.

In more details of the above method, in one exemplary implementation commercial photoresist solution is spin-coated onto the $SiO_2/p^{++}$ Si substrate at 4000 rpm and then thermally cured. Negative photoresist patterns are generated by making the areas exposed to light and removing materials from the exposed regions with a developer solution. After that, Te nanomesh is grown on both the pre-patterned photoresist and the uncovered substrates at the same time, with a growth time of 4 hours. After nanomesh growth, the patterned photoresist and the nanomesh on photoresist are removed through a lift-off process, while only the nanomesh grown on the uncovered substrates remained. The remained patterned Te nanomesh are capable of projecting microscale images as designed. A USAF (United States Air Force) 1951 resolution test target was used as a photomask to determine the patterning resolution. The test target used in this work has 6 groups (from +2 to +7), where each group has 6 elements, contributing to a maximum resolution detectability of 228.1 line pairs per millimeter (lp/mm). For image patterning of lake, baboon, peppers, and goldhill images, halftone patterns made on polyester-based films are used as photomasks.

Figure 4C:
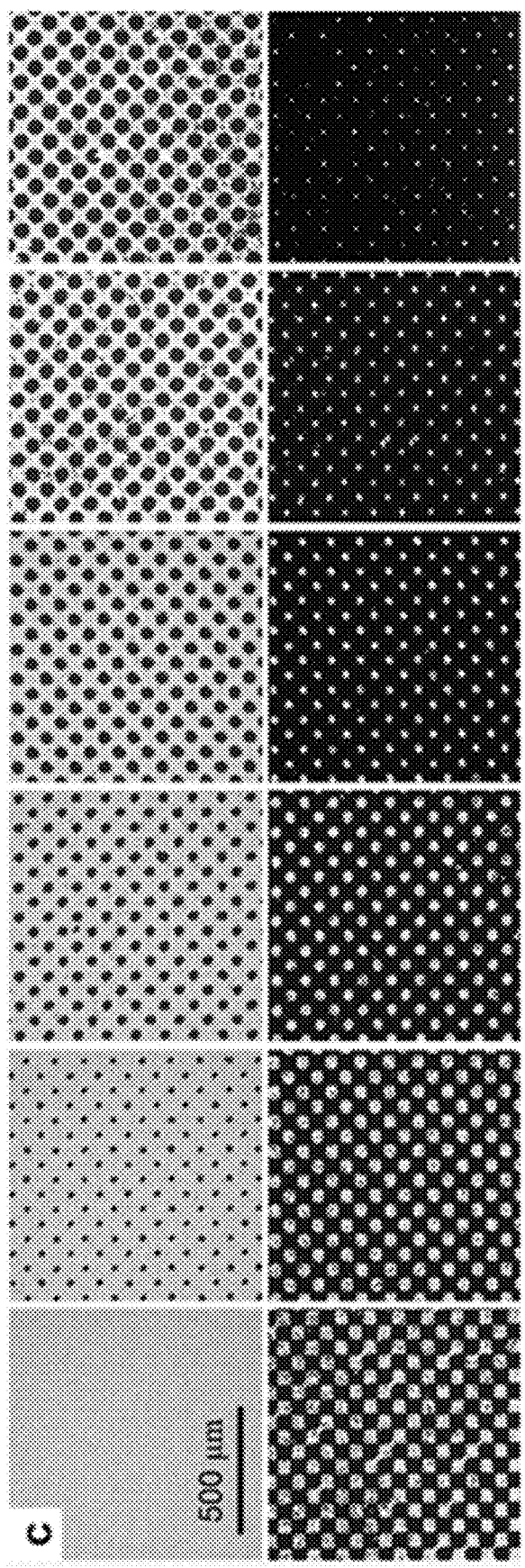
FIG. 4c includes optical images of halftone dots with different sizes and/or spacing that are made of the patterned Te nanomesh.
Figure 4D:
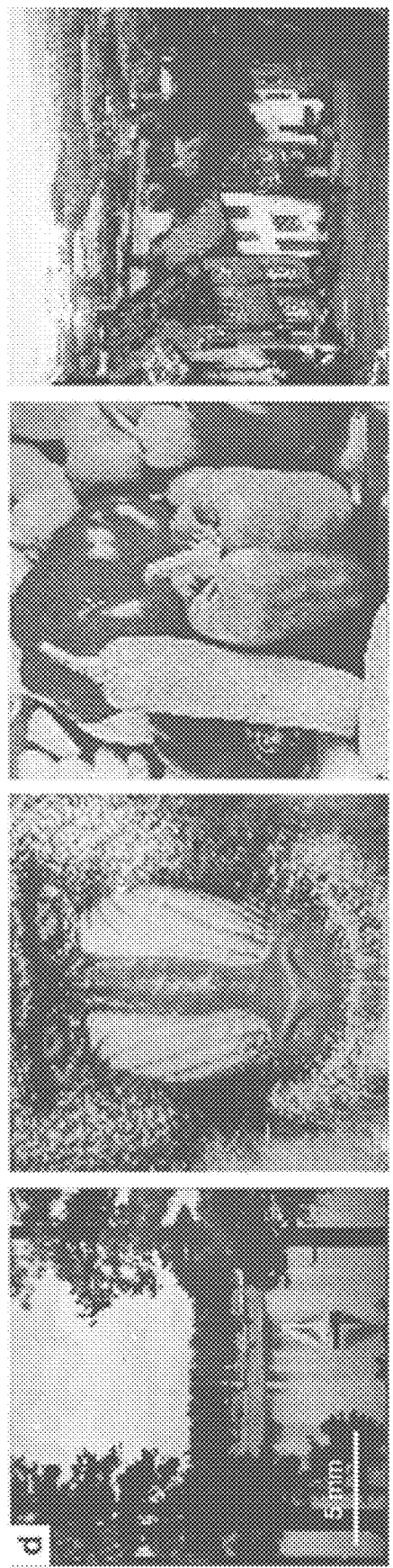
FIG. 4d shows optical images of lake, baboon, peppers, and goldhill images based on Te nanomesh.

Interestingly, the resulting Te nanomesh patterns have an excellent micrometer-level resolution, which is determined by using a 1951 USAF resolution test target as a photomask (see FIGS. 4b1-4b3). The resolution test (6 groups×6 elements) provides a maximum resolution detectability of 228.1 line pairs per millimeter (lp/mm), corresponding to one of the best results in microscale patterning of 1D nanomaterials. Based on the outstanding patterning ability, one could use a halftone reprographic technique to generate continuous-tone imagery by altering the size and/or spacing of halftone dots (see FIG. 4c). As demonstrated in FIG. 4d, different typical images, such as the lake, baboon, peppers, and goldhill, are made by patterned Te nanomesh through a halftone process. All the patterned images show high resolution and distinct edges, highlighting the robustness of large-area nanomesh patterning reported in this work. All these demonstrations of Te nanomesh patterning maintain both high resolution and cost-effectiveness, which could be extendable for other utilization.

Previously, patterning nanomaterials have mainly relied on the top-down "growth and etch" route, where it utilizes subtractive manufacturing to define and subsequently etch away unwanted parts. As high spatial resolution and repeated patterning are needed, it becomes time consuming and difficult to handle, posing fabrication challenges[40]. Also, the surface contaminations that introduced during etching would increase the chance for quality deterioration of as-grown nanomaterials. To avoid these issues, in some embodiments of the invention there is designed and explored an additive manufacturing ("bottom-up") nanomesh patterning technique to maintain material quality and possess μm-level resolution, being comparable to the masked growth of 2D materials (2 μm resolution)[40] and the direct lithography of inorganic nanocrystals (1 μm resolution)[41].

After that, a prototype of an all-nanomesh TFT is fabricated on the $SiO_2/p^{++}$ Si substrate (see FIGS. 4e1-4e3), in which $SiO_2$ and $p^{++}$ Si act as the dielectric and gate layers, respectively. A growth time of 3 hours was set to manufacture the device channel. After the nanomesh growth, 5/80-nm thick Cr/Au films are deposited by thermal evaporation with a shadow mask to define the source and drain regions. To fabricate all-nanomesh TFT on $SiO_2$ dielectric layer, the nanomesh growth process and the standard photolithography process were executed twice. Based on the tunable electrical properties of the Te nanomesh, the 3-hours grown semiconducting Te nanomesh is used as the device channel, while the 5-hours-grown metallic Te nanomesh are functioned as source/drain electrodes. It should be noted that prolonging the nanomesh growth duration (i.e., 5 hours) could dramatically improve the welding of NWs, featuring as the increasing inter-NW connection, the enlarging soldering junctions, and the thicker NW bodies. All these morphological changes could work together to enhance the nanomesh conductivity. Indeed, after 5-hours growth, the high conductivity of 266 S $cm^{-1}$ is obtained for the Te nanomesh, while also holds the good optical transparency (>80%) in the visible region at the same time. Given the high conductivity and optical transmittance, together with the unique NW network morphology, the conducting Te nanomesh could act well as the flexible p-type transparent conductors or device contact electrodes.

To measure the electrical characteristics of the prototype of the all-nanomesh TFT, an Agilent 4155C semiconductor analyzer was employed to measure the TFT performance in dark environment. The gate voltage sweeps from 10 V to −10 V, while source-drain voltage is biased at −0.1 V or −1 V. To better show the current carry capacity of Te nanomesh, its drain current density was calculated from the maximum drain current divided by the channel width, e.g. 7.5 mA/mm=0.75 mA/0.1 mm. The field-effect mobility in linear regime ($\mu_{lin}$) was calculated with the equation of $\mu_{lin}=(L \times g_m)/(W \times V_{ds} \times C)$, where L is the channel length, W is the channel width, $g_m$ is the transconductance, $V_{ds}$ is the source-drain voltage, and C is the areal capacitance of 69 nf cm$^{-2}$ for 50 nm thick gate dielectric of $SiO_2$. For photodetector measurements of the intrinsic Te nanomesh and the Te nanomesh/$WS_2$ heterostructure, 1550 nm and 532 nm laser diodes are used as light sources, respectively. The incident light powers were measured by a power meter (PM400, Thorlabs). The responsivity (R) are defined as $R=I_{light}/(P \times A)$, where $I_{light}$, P and A are the photocurrent, incident power density and effective irradiated area, respectively. The external quantum efficiency (EQE) was calculated with the equation of $EQE=(I_{light}/e)/(P \times A/hv)$, where e and hv are the electronic charge and energy of an incident photon, respectively.

Evidently, the linear I-V relationships (from −1 V to 1V) of the output curve of all-nanomesh TFTs indicate an ohmic-like electrical contact between the nanomesh channel and the nanomesh electrodes. From the transfer curves of all-nanomesh TFTs (see FIGS. 4e1-4e3), all devices demonstrate the good p-type transistor performance with the peak hole mobility of 107±15 cm$^2$/Vs and the on-current of 6.0±0.5 mA/mm. A slight TFT mobility reduction is observed after changing the contact electrodes from Au film to metallic Te nanomesh. However, the mobility is still higher than those of intrinsically flexible semiconductors (e.g., organic films or polycrystalline metal oxide nanofibers) that usually possess the field-effect mobility of 1~10 cm$^2$/Vs. The outstanding mobility values from the all-nanomesh device are related to the high-quality nanomesh fabrication and good compatibility with the nanomesh patterning process.

Figure 5A:
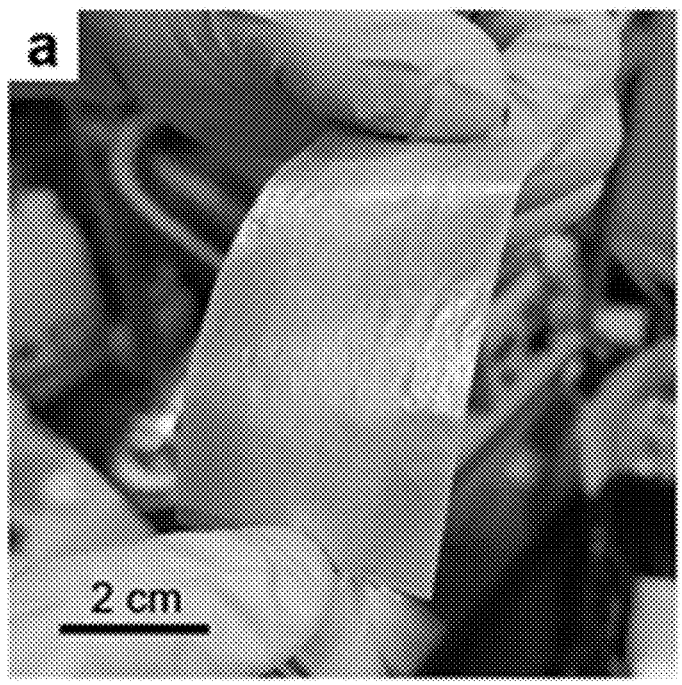
FIG. 5a is a hotograph of wafer-scale Te nanomesh grown on paper substrates according to an embodiment of the invention.
Figure 5B:
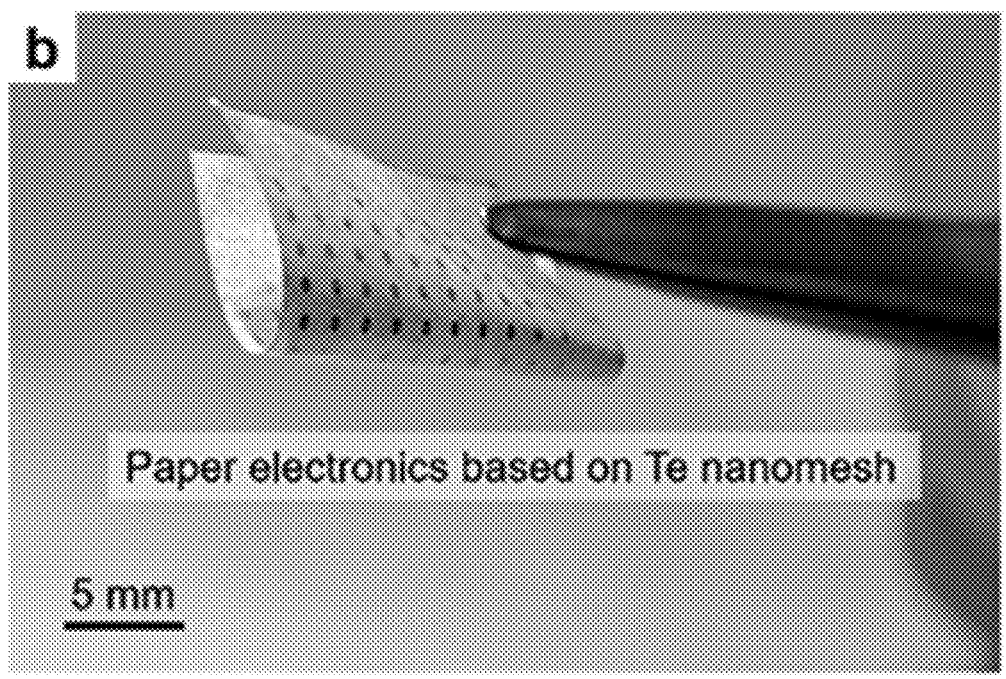
FIG. 5b is a photograph of the Te nanomesh PD (photodetector) based on paper substrates.

Next, paper-based vdWs nanomesh infrared photodetectors according to embodiments of the invention will be discussed. As discussed above, the goal of developing Te nanomesh fabrication is to realize low-cost and high-performance devices that can be implemented in large-area and cost-effective IoT applications. Paper is a kind of promising substrate for flexible and environmentally sustainable electronics[42]. Notably, the multi-substrate compatible growth process allows grow Te nanomesh on large-area paper substrates for device applications (see FIG. 5a). To this end, by utilizing Te nanomesh as a light absorption component, the high-performance paper-based infrared photodetectors (PDs) is demonstrated for the first time (see FIG. 5b). As depicted in the SEM image in FIG. 5c, the uniform well-connected Te nanomesh is tightly attached to the paper surface, providing a navigable electrical channel between source/drain electrodes.

Room-temperature photodetector measurements are then carried out by using a 1550-nm infrared light source, which is an important wavelength for long-distance telecommunications[16,43]. Typically, crystalline Si or group III-V semiconductors dominate short-wave infrared (SWIR; from 1400 to 3000 nm) photodetector applications[43]. These PDs have excellent photodetector performance, but most involve complex growth/fabrication procedures and operate in a cooled environment[44]. On the opposite, the room-temperature operating nanomesh PDs eliminate the cooling requirements, which can substantially reduce the corresponding detector size, cost, and power consumption on temperature control, thus extending their application scopes. When exposed to the light illumination with an incident power density of 4 mW/cm$^2$, the photocurrent of the paper-based Te nanomesh device is significantly increased to ~78 μA, corresponding to a responsivity of 23.3 A/W and an external quantum efficiency (EQE) of 2.9×10$^3$% (see FIGS. 5d1-5d2). Such a responsivity has already outperformed the reported Te nanoflake infrared PDs[16] and the commercially available Si and InGaAs photodiodes[45].

Figure 5F:
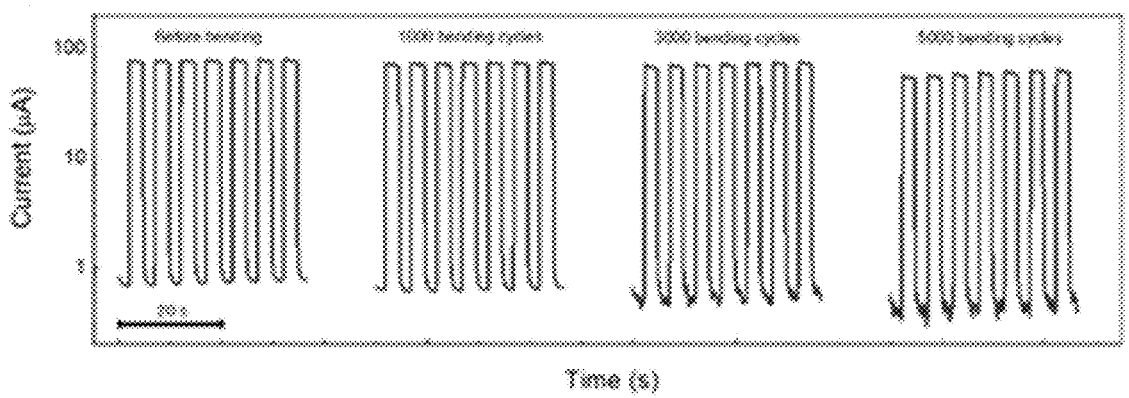
FIG. 5f illustrates a photoresponse of the paper-based Te nanomesh PD with varying bending cycles during the bending test from 0 to 5000 times.
Figure 5G:
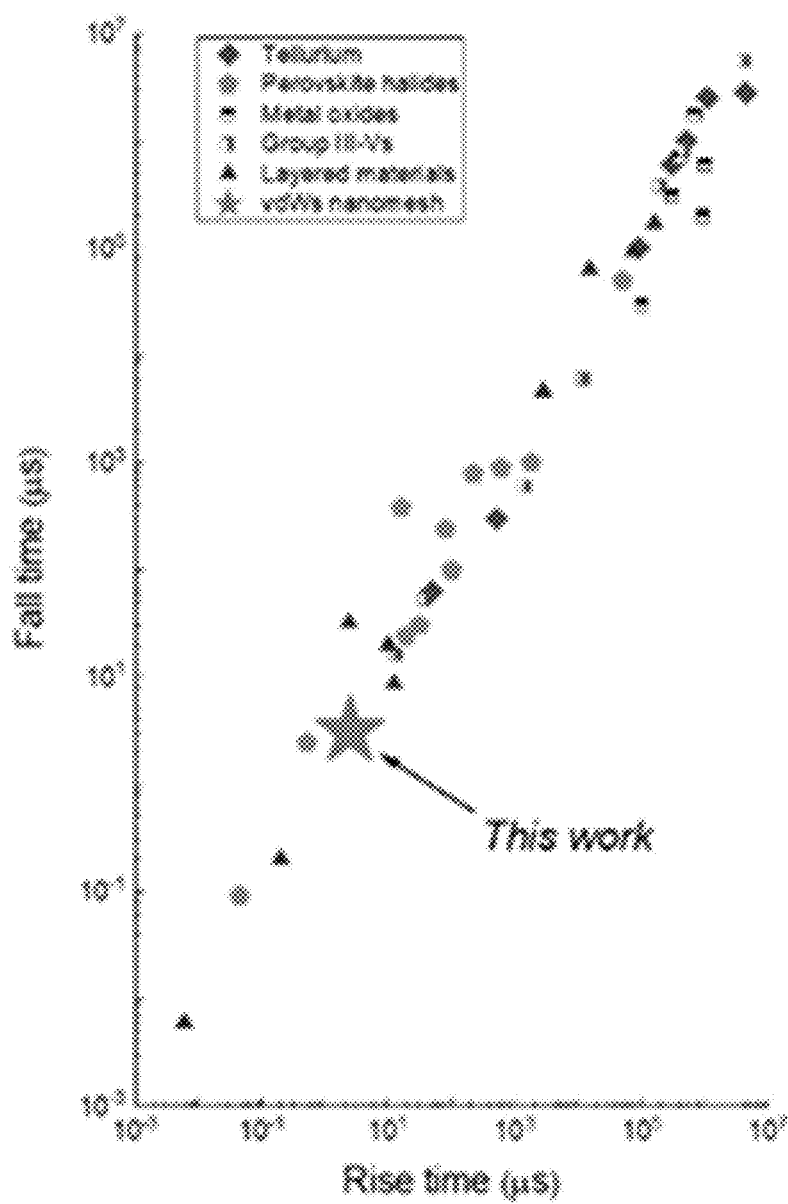
FIG. 5g shows a comparison of the photo-response speed of tellurium, perovskite halides, metal oxides, group III-Vs, layered materials, and Te nanomesh.
Figure 6A:
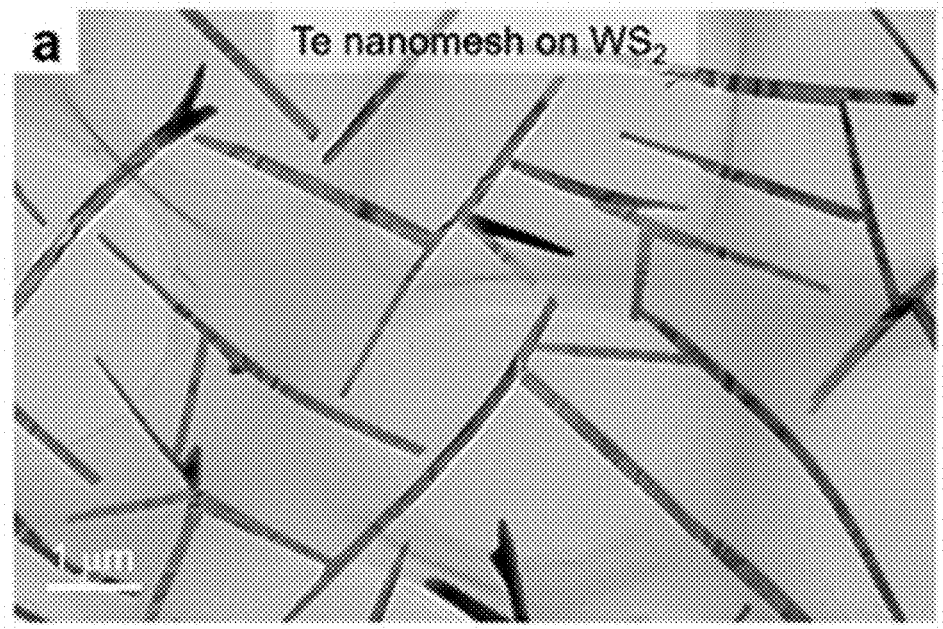
FIG. 6a illustrates a TEM image of a Te nanomesh/monolayer $WS_2$ mixed-dimensional heterostructure.
Figure 6B:
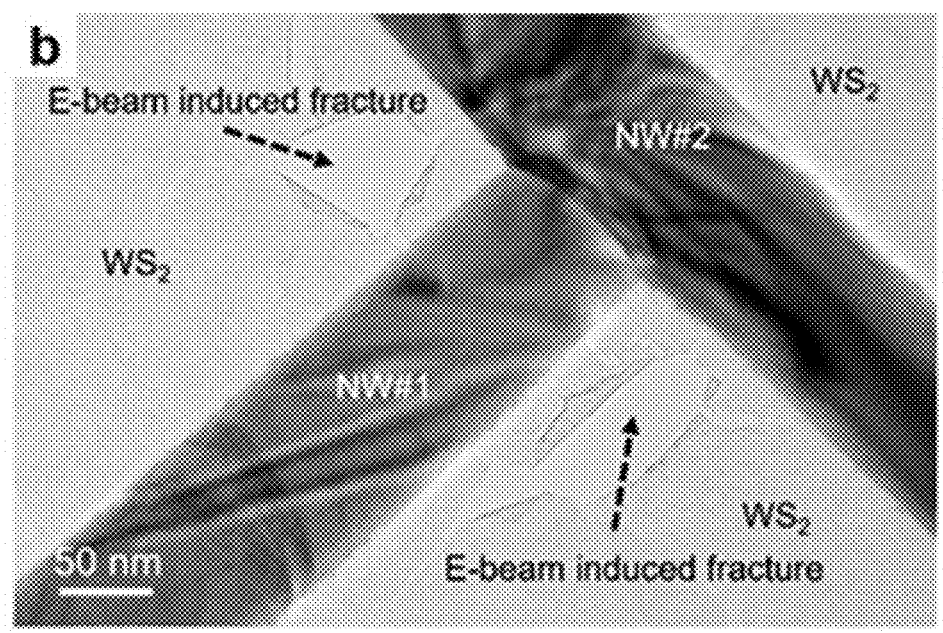
FIG. 6b is an enlarged view of a junction of two NWs in the TEM image of the Te nanomesh/monolayer $WS_2$ mixed-dimensional heterostructure.
Figure 6E:
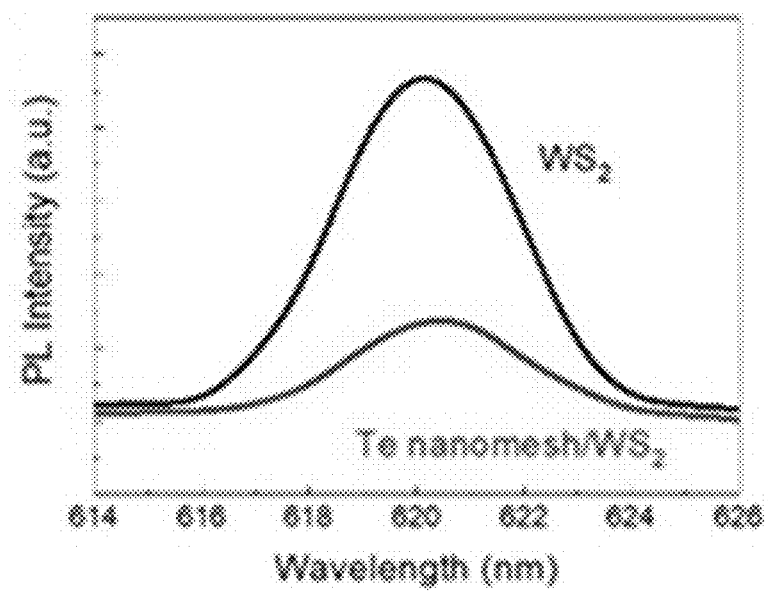
FIG. 6e shows the PL (photoluminescence) of Te nanomesh/monolayer $WS_2$ heterostructures.
Figure 6F:
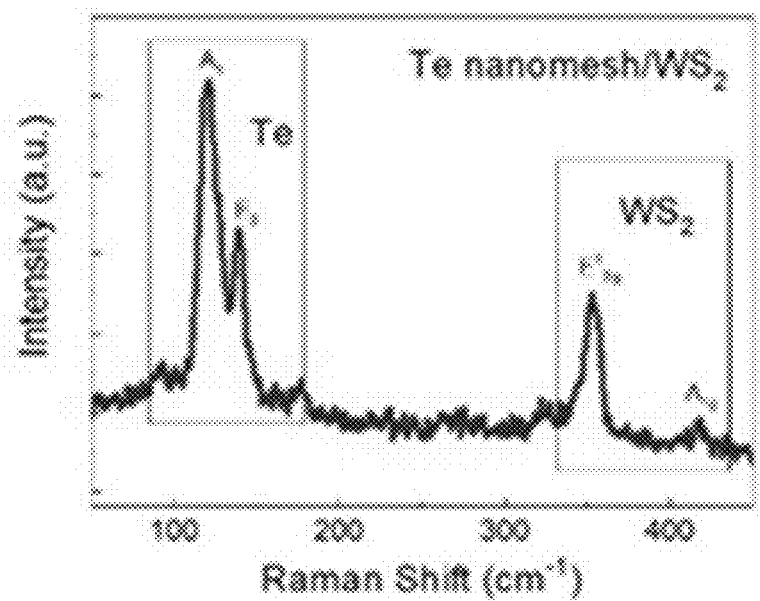
FIG. 6f shows the Raman of the Te nanomesh/monolayer $WS_2$ heterostructures.
Figure 6G:
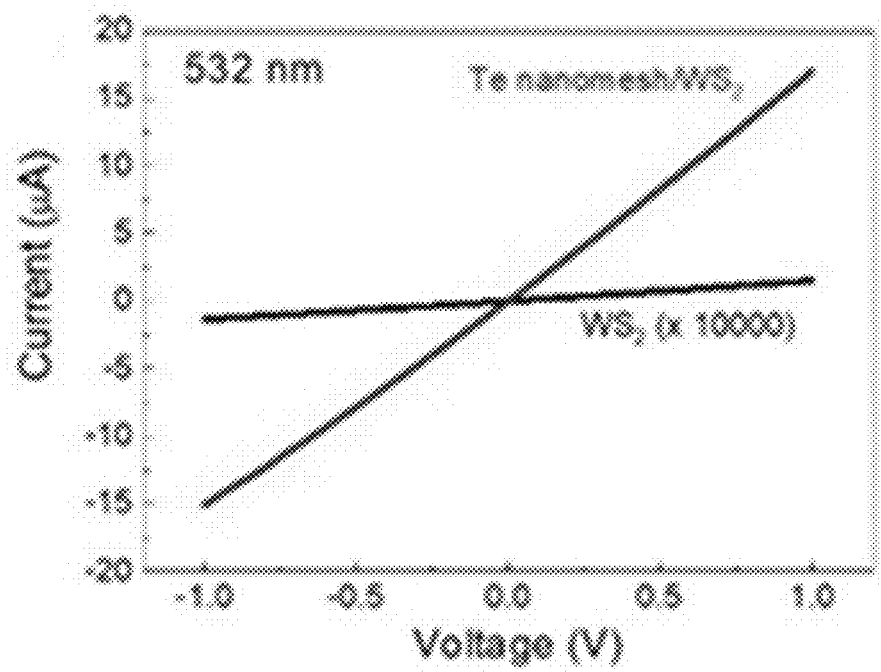
FIG. 6g shows the voltage-current characteristic of the photodetector performance of Te nanomesh/monolayer $WS_2$ heterostructures measured at 532 nm irradiation with an incident power density of 1 $mW/cm^2$.
Figure 6H:
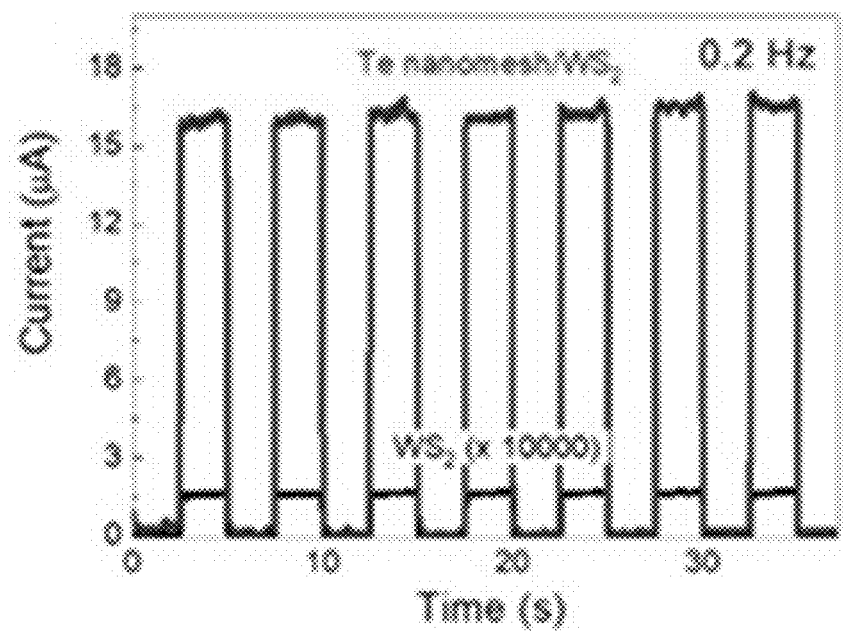
FIG. 6h shows the time-current characteristic of the photodetector performance of Te nanomesh/monolayer $WS_2$ heterostructures measured at 532 nm irradiation with an incident power density of 1 $mW/cm^2$.

The transient response is also critical for PDs and is highly dependent on the efficient transport/collection of photo-generated charge carriers[46,47]. The transient output signals of Te nanomesh PDs are measured at room temperature under modulated light illumination. The 3 dB cutoff frequency (i.e. the frequency at its 0.707 times peak photoresponse) of the paper-based Te nanomesh PD is estimated to be ~100 kHz. At the same time, the Te nanomesh devices exhibit excellent reliability and fast optical response in switching measurements with chopping frequencies ranging from 0.2 Hz, 1 kHz, 10 kHz, to 100 kHz (See FIGS. 5d1-5d2 and 5e1-5e6). In specific, at a chopping frequency of 100 kHz, the response times defined by the varying time for the photocurrent from 10% to 90% and from 90% to 10% are found to be 2.5 μs (rise time) and 3.1 μs (fall time), respectively (see FIGS. 5e1-5e6). The s-level response time is faster than most PDs reported in recent literature (as summarized in FIG. 5g)[48-50]. High material quality, high light absorption efficiency, and naturally terminated surfaces work together to contribute to the good PD performances of Te nanomesh, particularly the excellent rise/fall time and strong photo-gating effect.

In addition to the excellent PD performance, the paper-based Te infrared PDs are also lightweight and mechanically robust for easy handling. To determine the mechanical durability of nanomesh PDs, the on-off switching behavior of photocurrent was evaluated with different bending cycles at a fixed 0.5-cm bending radius (see FIG. 5c). No detectable photocurrent deterioration is observed through the entire bending test with bending cycles up to 5000 as presented in FIG. 5f. Also, bending test was performed on flexible Te nanomesh PDs based on thin mica substrates, where similar robust device performance was obtained with bending test, which is mainly driven by the intrinsic superior mechanical properties of self-welded Te nanomesh. Overall, the obtained PD performance metrics including responsivity, response time and device durability are better than the reported Te PDs and comparable to those PDs based on state-of-the-art nanomaterials. Based on the technological importance of 1550-nm infrared photodetection, the combination of high-quality Te vdWs nanomesh and low-cost paper substrates could be utilized in the cost-efficient IoT applications, for instance, disposable (opto-)electronics or smart packaging[42].

Next, nanomesh/layered material vdWs heterojunctions are discussed. Owing to the versatile fabrication process, Te nanomesh could be heterogeneously integrated with other semiconductors to construct heterojunctions. As a kind of typical layered transitional metal chalcogenides semiconductors, tungsten disulfide ($WS_2$) is selected because of its good environmental stability and easy accessibility. In a preferred embodiment of the invention, monolayer $WS_2$, consisting of multi-domains (with an average domain size of ~10 μm)[51], is fabricated by a chemical vapor deposition method that is also compatible with the wafer-scale device technology[52]. After the Te nanomesh growth, the continuous Te nanomesh is witnessed on the top surface of $WS_2$ layer from the detailed TEM study (see FIGS. 6a to 6c3). In the $WS_2$ regions, explicit lattice fringes are identified in the high-resolution TEM image in FIGS. 6c1-6c3, where the lattice spacing is found to be 2.7 Å, corresponding to the {100} planes of $WS_2$ crystals. This observation reveals that the low-temperature Te nanomesh synthesis does not alter the crystalline properties of the underlying $WS_2$ monolayer, eliminating the possible adverse influence of the interfacial chemical reactivity or interdiffusion that would lead to device performance degradation in the subsequent studies.

To determine the relationship between the Te nanomesh and the underlying $WS_2$ layer, SAED study was carried out on the heterojunction region. Remarkably, there are three sets of diffraction spots found in the SAED pattern that are collected from the Te/$WS_2$ heterojunction region, in which two sets belong to the welded Te NWs and one set belongs to the underlying $WS_2$ layer. The SAED pattern suggests that the Te nanomesh vdWs epitaxially grow on the $WS_2$ layer, supporting the proposed growth mechanisms developed in this work related to multi-scale vdWs interactions. After that, EDS mappings are also performed to evaluate the 1D/2D heterostructure, where S is uniformly distributed throughout the entire heterostructure and Te is concentrated in the nanomesh regions (see FIGS. 6d1-6d3). Similar results are also found in the Raman mapping study (see FIG. 6f). All these material characterizations confirm the structural integrity of the 1D/2D mixed-dimensional vdWs heterostructure here.

After the successful construction of Te nanomesh/$WS_2$ heterostructures, their photoelectric performance is also investigated. After applying the 532-nm light irradiation with a power density of 1 mW/cm$^2$, the photocurrent of the Te nanomesh/$WS_2$ PD is significantly increased by 100,000 times (from 0.15 nA to 17 μA) when compared to the intrinsic $WS_2$ layer (see FIGS. 6g and 6h), together with a significant responsivity enhancement from 5 mA/W to 566.7 A/W. Impressively, the Te/$WS_2$ heterostructure devices exhibit excellent reliability and fast optical response in switching measurements with chopping frequencies ranging from 1 kHz, 10 kHz, to 100 kHz. In specific, at a chopping frequency of 100 kHz, the response times are found to be 3.0 μs (rise time) and 4.3 μs (fall time), respectively, being close to those of intrinsic Te nanomesh PDs. The responsivity and response time of the Te nanomesh/$WS_2$ monolayer mixed-dimensional heterostructure already outperforms most of the $WS_2$-based PDs reported until now. As the Te nanomesh has weak optical absorption efficiency in the region of 532 nm, the significantly improved photodetector performance can only be contributed by the band alignment at the Te nanomesh/$WS_2$ heterojunction.

In principle, type-II band alignments could facilitate the separation of photo-generated electron-hole pairs, which is driven by the built-in electric field at the heterostructure interface[46,53]. In this case, the longer non-equilibrium carrier lifetime and the higher photo-gain would be granted to the Te nanomesh/$WS_2$ heterojunction when compared to intrinsic $WS_2$ layers. As a result, the transferred charge carriers could rapidly transport through the Te nanomesh and be efficiently collected by the source/drain electrodes under bias. This phenomenon is further supported by the photoluminescence (PL) study in FIG. 6e. The intrinsic $WS_2$ layer exhibits strong excitonic emission with a dominant PL emission peak at 620 nm, agreeing well with the literature. In contrast, the Te nanomesh/$WS_2$ heterostructure shows apparent PL quenching, which indicates the interfacial charge carrier transfer between the Te nanomesh and the underlying $WS_2$ layer[51]. Based on the Te nanomesh/$WS_2$ heterostructure band alignment, Te nanomesh donates electrons into $WS_2$ spontaneously (as n-doping) while holes would transfer to the Te nanomesh at the same time (as p-doping). The n-type doping process in $WS_2$ layer was studied by X-ray photoelectron spectroscopy (XPS), as judged by the blue shifts (~0.2 eV) of W 4f peaks and S 2p peaks after Te nanomesh deposition[54]. Determined by dynamics of excitons and charge carriers at the heterointerfaces, the Te nanomesh/$WS_2$ heterostructures could yield the impressively efficient separation and collection of the photo-generated electron-hole pairs, and thus giving rise to the outstanding photoelectric performance of mixed-dimensional vdWs PDs.

One can see that the embodiment of the invention is about the vapor-phase growth of Te nanomesh achievable at 100° C. based on the ubiquitous vdWs interactions, and show that the self-welded nanomesh can be reliably grown on arbitrary surfaces. The multi-scale vdWs interactions, existing among Te atomic chains as well as between Te nanomesh and substrates, govern the lateral nanomesh growth and multiple-surface growth compatibility.

The low-temperature Te nanomesh synthesis offers many advantages for high-performance electrical applications. i) The self-assembled Te nanomesh could be grown on various types of surfaces, including rigid substrates, flexible substrates, layered van der Waals material surfaces, and three-dimensional curved surfaces. There is no concern about compatibility between the target device substrate and the NW growth process; thereby, devices can be made on diverse technologically functional surfaces in a scalable and low-cost manner that cannot be achieved by other means. ii) The Te nanomesh synthesis presented in this invention is simply based on the multi-scale vdWs interactions, i.e., the macroscale quasi-vdWs interactions to substrates and the nanoscale vdWs interactions among Te chains. Unlike the growth mechanisms proposed for metal-catalyzed or epitaxial growth that mainly rely on the complicated liquid-solid interface and epitaxial relationship, the multi-scale vdWs interactions-dominated growth according to embodiments of the invention is spontaneous, efficient, and substrate-independent. iii) Because all the vdWs interactions explored here are parallel to the growth substrates, the Te NWs would laterally grow on the substrates and then assembly into NW networks. This laterally grown nanomesh is beneficial to the subsequent device integrations, as most present-day devices are fundamentally planar in architectures. Moreover, the low-temperature nanomesh fabrication approach would not involve any chemical reaction and associated damage on typical substrate materials. Therefore, directly growing Te nanomesh on heat-intolerant flexible or stretchable substrates, such as polyimide (PI), and polydimethylsiloxane (PDMS), is now accessible. iv) A self-welding process is found in the Te nanomesh growth process, which is essential for promoting electrical device performance and mechanical robustness. Compared to the NW networks formed by solution-phase deposition schemes that always give the weak physical inter-NW connection, the self-welded nanomesh with well-connected network morphology is expected to exhibit reduced inter-NW junction resistance and improved mechanical robustness, making them a kind of potentially reliable active device component for practical applications.

The exemplary embodiments are thus fully described. Although the description referred to particular embodiments, it will be clear to one skilled in the art that the invention may be practiced with variation of these specific details. Hence this invention should not be construed as limited to the embodiments set forth herein.

While the embodiments have been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

What is claimed is:

1. A method of growing semiconducting tellurium (Te) nanomesh, comprising the steps of:
   a) preparing a substrate;
   b) vaporizing Te powders under a first temperature; and
   c) growing Te nanomesh on the substrate using the vaporized Te powders under a second temperature; a growth of the Te nanomesh involving multi-scale van der Waals (vdWs) interactions of Te molecules; the multi-scale vdWs interactions comprising macroscale quasi-vdWs interactions with spontaneous misfit relaxation to the substrate, and nanoscale vdWs interactions among Te atomic chains;
wherein the first temperature is higher than the second temperature.

2. The method according to claim 1, wherein the substrate comprises a curved surface on which the vaporized Te powders are deposited.

3. The method according to claim 1, wherein the second temperature is 100° C.

4. The method according to claim 1, wherein the first temperature is in the range of 450-500° C.

5. The method according to claim 1, further comprises, between Steps b) and c), the step of transporting the vaporized Te powders to a surface of the substrate.

6. The method according to claim 5, wherein in the transporting step argon gas is used to transport the vaporized Te powders.

7. The method according to claim 1, wherein Step c) further comprises:
   a) nucleating Te molecules on the substrate;
   b) laterally growing nanowires; and
   c) self-welding the nanowires to form the Te nanomesh.

8. A method of creating patterned tellurium (Te) nanomesh, comprising the steps of:
   a) pre-patterning photoresist on a substrate;
   b) growing Te nanomesh on the substrate according to the method of claim 1; and
   c) lifting off the photoresist from the substrate.

9. The method according to claim 1, wherein the multi-scale vdWs interactions are parallel to the substrate.

10. The method according to claim 9, wherein in Step c), the Te nanomesh is laterally grown on the substrate.

11. The method according to claim 1, wherein the Te nanomesh is self-welded.

* * * * *